United States Patent
Oh et al.

(10) Patent No.: US 7,442,988 B2
(45) Date of Patent: Oct. 28, 2008

(54) SEMICONDUCTOR DEVICES AND METHODS OF FABRICATING THE SAME

(75) Inventors: Chang-Woo Oh, Suwon-si (KR); Ki-Whan Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/604,943

(22) Filed: Nov. 28, 2006

(65) Prior Publication Data

US 2007/0122979 A1   May 31, 2007

(30) Foreign Application Priority Data

Nov. 30, 2005  (KR) .................. 10-2005-0115640

(51) Int. Cl.
*H01L 27/108*  (2006.01)
(52) U.S. Cl. ............... 257/321; 257/314; 257/315; 257/316; 257/317; 257/318; 257/319
(58) Field of Classification Search ........... 257/314, 257/315, 316, 317, 318, 319, 320, 321
See application file for complete search history.

(56) References Cited

U.S. PATENT DOCUMENTS

| 6,157,060 A | 12/2000 | Kerber |
| 2004/0232471 A1 | 11/2004 | Shukuri |

FOREIGN PATENT DOCUMENTS

| JP | 2004-253571 | 9/2004 |
| KR | 10-0417449 | 6/2004 |

*Primary Examiner*—Evan Pert
*Assistant Examiner*—Tan N Tran
(74) *Attorney, Agent, or Firm*—Mills & Onello LLP

(57) ABSTRACT

Disclosed is a semiconductor device and method of fabricating the same. The device is disposed on a substrate, including a fin constructed with first and second sidewalls, a first gate line formed in the pattern of spacer on the first sidewall of the fin, and a second gate line formed in the pattern of spacer on the second sidewall of the fin. First and second impurity regions are disposed in the fin. The first and second impurity regions are isolated from each other and define a channel region in the fin between the first and second gate lines.

19 Claims, 35 Drawing Sheets

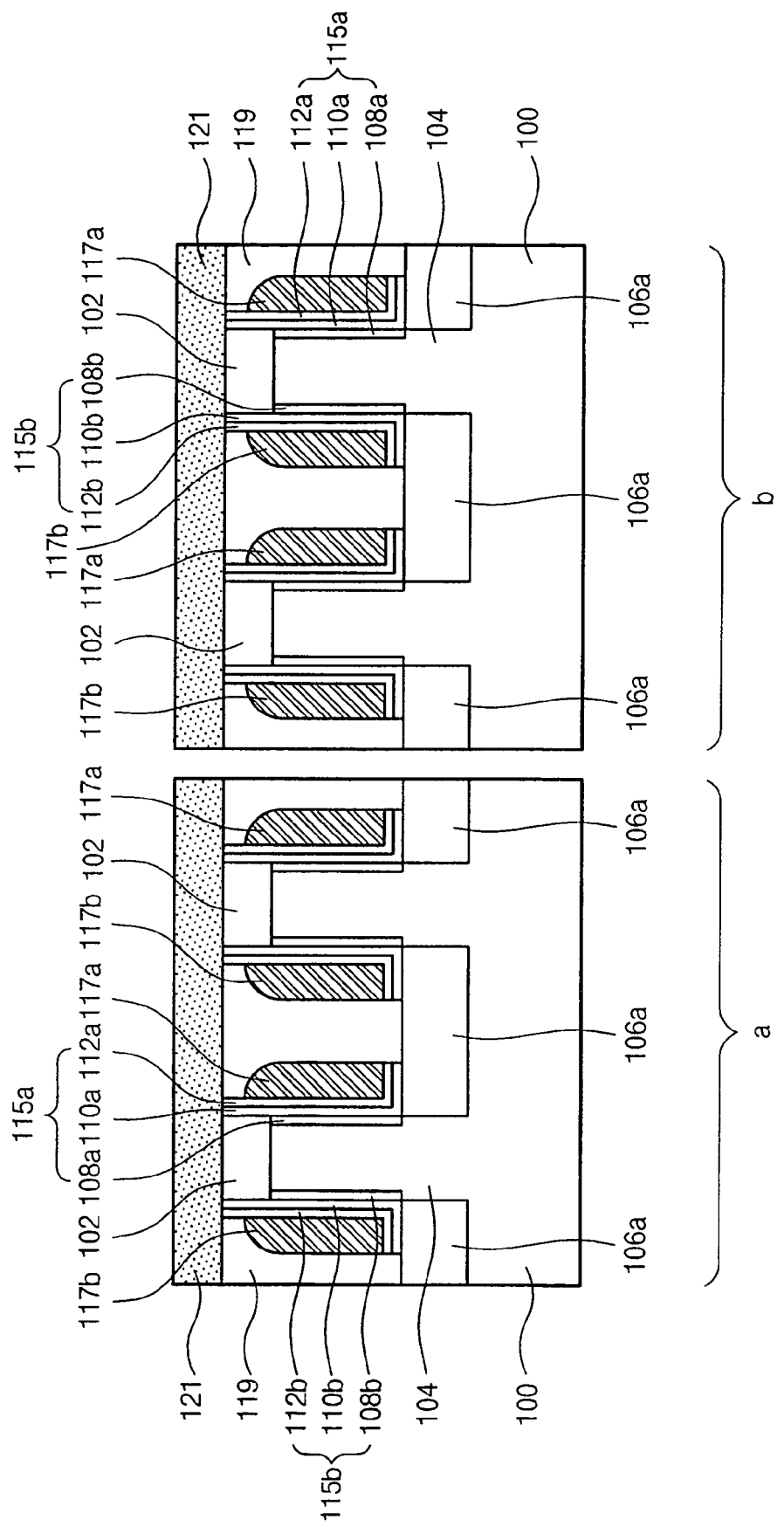

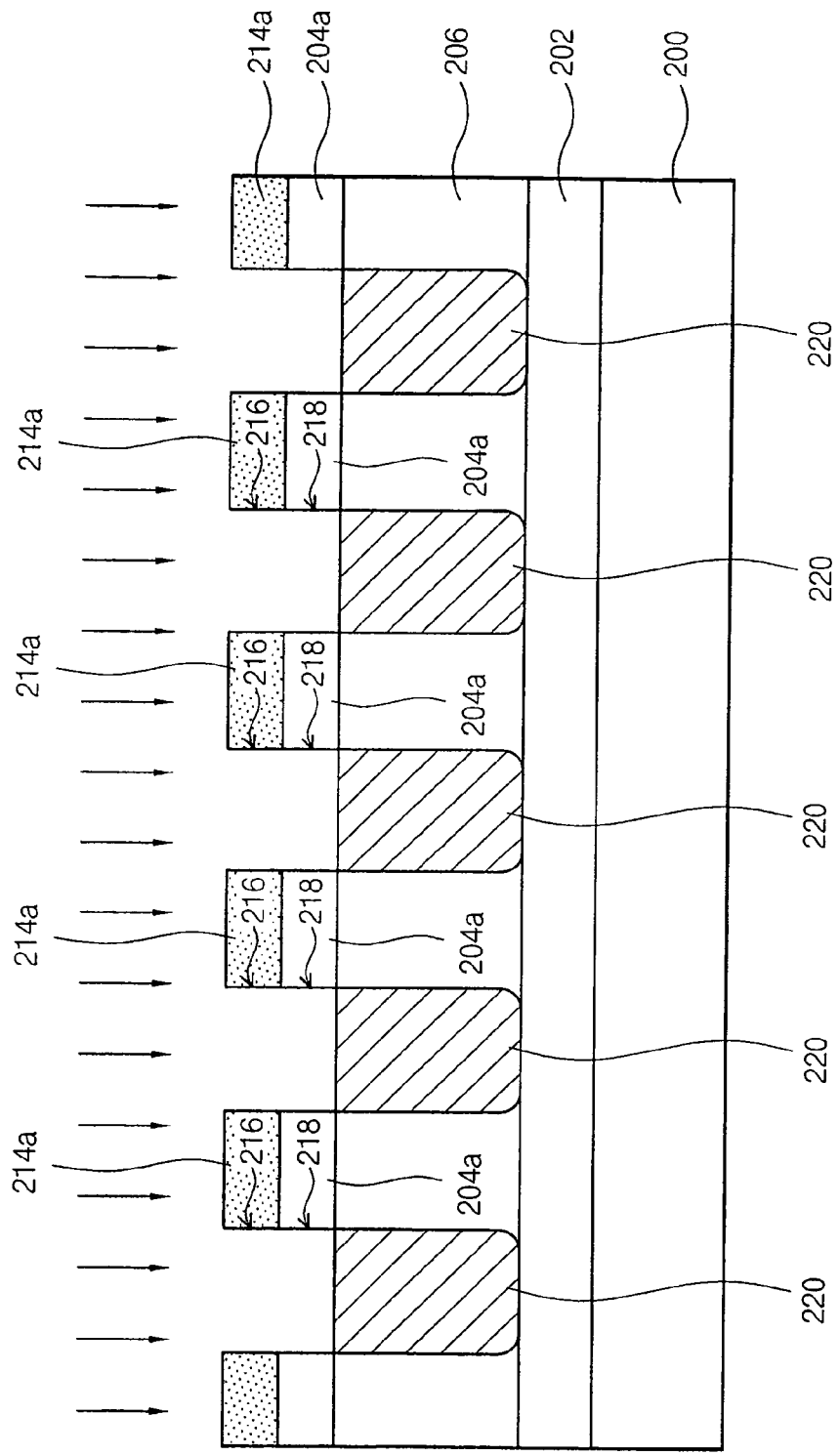

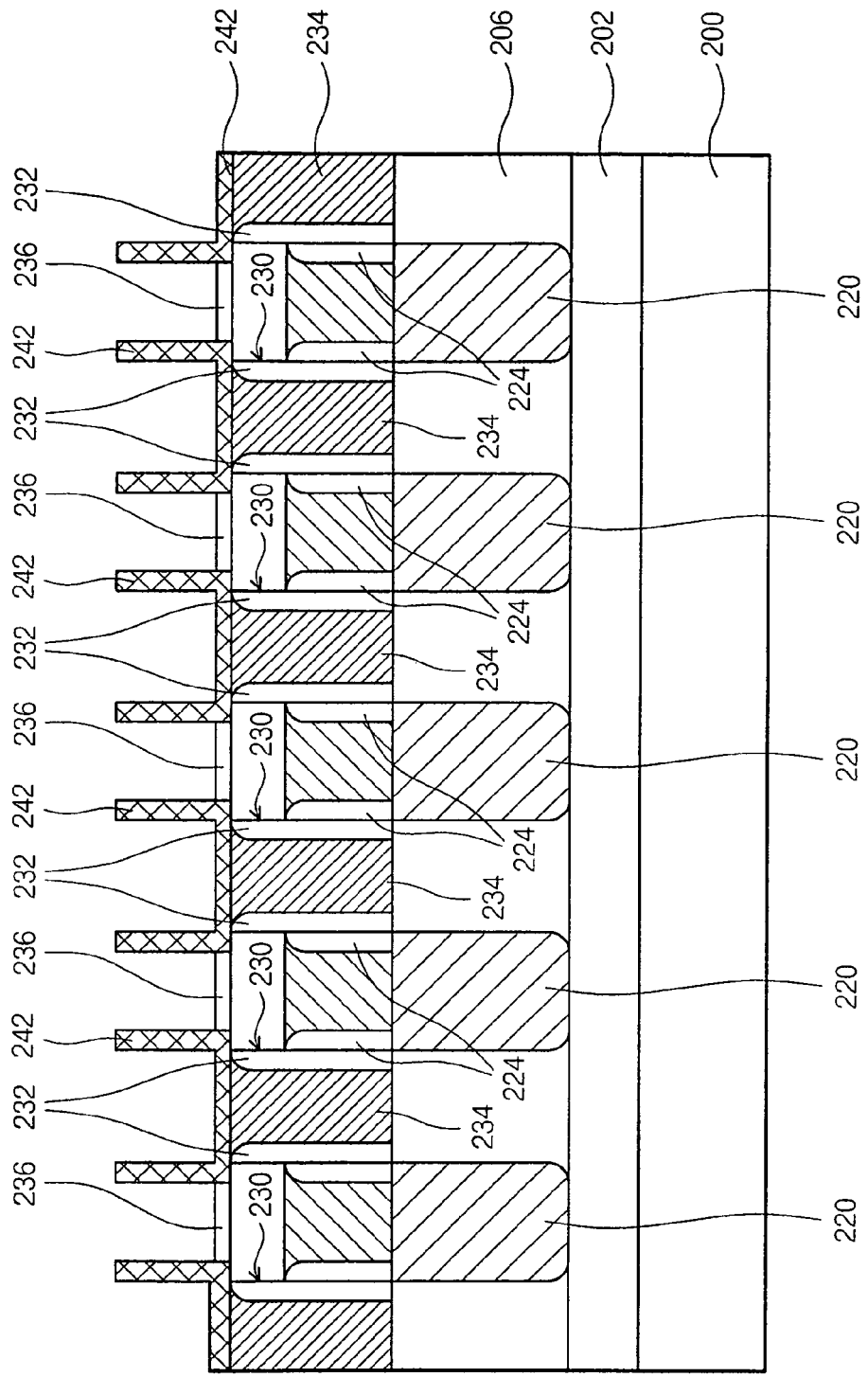

SEMICONDUCTOR DEVICES AND METHODS OF FABRICATING THE SAME

CROSS-REFERENCE TO RELATED APPLICATIONS

This U.S. non-provisional patent application claims priority under 35 U.S.C. §119 to Korean Patent Application 10-2005-0115640 filed on Nov. 30, 2005, in the Korean Intellectual Property Office, the entire contents of which are hereby incorporated by reference.

BACKGROUND

The present invention is concerned with semiconductor devices and methods of fabricating the same, and in particular relates to a semiconductor device and method of fabricating the same suitable for high integration density.

With great evolution of semiconductor technologies, semiconductor devices are being highly integrated more and more. The higher integration of semiconductor devices offers many advantages. For example, it makes a chip size smaller to raise the productivity thereof and increases the number of unit elements, resulting in high-performance semiconductor devices. Further, the higher integration is helpful to constructing semiconductor memory devices with larger capacity of data storage and reducing power consumption therein.

However, the higher integration also comes with various troubles in the semiconductor devices. For example, field effect transistors used as basic unit elements in the semiconductor devices would be deteriorated in characteristics due to short channel effects deepening while their channel lengths are being shortened. Those characteristic degradations in field effect transistors reduces the performance of nonvolatile memory devices, such as flash memories employing field effect transistor for memory cells, as well as volatile memory devices such as DRAMs or SRAMs. This can be especially troublesome in DRAMs, where it is inevitable to raise heights of storage nodes for large-performance capacitors, causing high step differences therein. Such high step differences would incur various kinds of defects in processing steps, e.g., photolithography or etching steps, resulting in degradation of productivity.

SUMMARY OF THE INVENTION

The present invention is directed to a semiconductor device and method of fabricating the same, with high integration density.

In accordance with one aspect of the invention, provided is a semiconductor device comprising a fin disposed on a substrate, the fin having first and second sidewalls opposite to each other, a first gate line formed on the first sidewall of the fin in the shape of a spacer, and a second gate line formed on the second sidewall of the fin in the shape of a spacer. First and second impurity layers isolated from each other are disposed in the fin, forming a channel region in the fin between the first and second gate lines. An interlevel insulation pattern covers the substrate and the first and the second gate lines around the fin. First and second bit lines are connected to the first and second impurity layers, intersecting the fin in parallel and being isolated from each other.

The semiconductor device can further comprise a first multi-level insulation film interposed between the first gate line and the first sidewall of the fin, including a first charge-trapping insulation film, and a second multi-level insulation film interposed between the second gate line and the second sidewall of the fin, including a second charge-trapping insulation film. And also includes an insulating line pattern intersecting the fin between the first and second bit lines and covering the channel region, wherein the first line contacts the first sidewall of the insulating line pattern and the second bit line contacts the second sidewall of the insulating line pattern.

The semiconductor device can further comprise: a capping pattern interposed between the insulating line pattern and the channel region, wherein the first bit line fills a first opening that is enclosed by the interlevel insulation pattern and a sidewall of the capping pattern and reveals an upward face of the first impurity layer, wherein the second bit line fills a second opening that is enclosed by the interlevel insulation pattern and another sidewall of the capping pattern and reveals an upward face of the second impurity layer.

The first and second gate lines can extend upward to be adjacent with the sidewalls of the capping pattern and protrude higher than the upward faces of the first and second impurity layers, wherein the first multi-level insulation film partially extends upward to be interposed between the first bit line and the protruding portion of the first gate line, and wherein the second multi-level insulation film partially extends upward to be interposed between the second bit line and the protruding portion of the second gate line.

The semiconductor device can further comprise: insulation spacers interposed between the first bit line and a sidewall of the first opening, and between the second bit line and a sidewall of the second opening.

The first charge-trapping insulation region can include a first region adjacent to the first impurity layer and a second region adjacent to the second impurity layer, and the second charge-trapping insulation film includes third region adjacent to the first impurity layer and fourth region adjacent to the second impurity layer, wherein at least one of the first, second, third, and fourth regions is a data storage field.

The first multi-level insulation film can further comprise: a first tunnel insulation film contacting to the first sidewall of the fin; and a first blocking insulation film contacting to the first gate line, and the second multi-level insulation film can further comprise: a second tunnel insulation film contacting to the second sidewall of the fin, and a second blocking insulation film contacting to the second gate line. The first charge-trapping insulation film can be interposed between the first tunnel insulation film and blocking insulation film, while the second charge-trapping insulation film is interposed between the second tunnel insulation film and blocking insulation film.

The bottom face of the fin can contact the substrate, which further comprises a field isolation film covering lower portions of the sidewalls of the fin and the substrate around the fin, wherein the first and second gate lines are disposed on the field isolation film.

The semiconductor device can further comprise a buried insulation film disposed on the substrate, wherein the fin, and the first and second gate lines can be disposed on the buried insulation film.

The bottoms of the first and second impurity layers can be spaced apart from the top of the buried insulation film.

According to an embodiment, the semiconductor device can further comprise a buried insulation film interposed between the fin and the substrate, and a gate insulation film interposed between the first gate line and the first sidewall of the fin, and between the second gate line and the second sidewall of the fin. Included is an insulating line pattern intersecting the fin between the first and second bit lines and covering the channel region, wherein the first and second bit lines contact each to both sidewalls of the insulating line pattern. In this structure, the bottoms of the first and second impurity layers contact with the buried insulation film to float the channel region, and wherein the floating channel region is used as a data storage field.

The buried insulation film can cover the substrate, wherein the first and second gate lines can be disposed on the buried insulation film, and the top of the insulating line pattern can be level with the tops of the first and second bit lines.

The semiconductor device can further comprise a capping pattern interposed between the insulating line pattern and the channel region, wherein the first bit line fills a first opening that is enclosed by the interlevel insulation pattern and a sidewall of the capping pattern, and reveals an upward face of the first impurity layer, wherein the second bit line fills a second opening that is enclosed by the interlevel insulation pattern and the other sidewall of the capping pattern and reveals an upward face of the second impurity layer.

The first and second gate lines can extend upward to be adjacent with the sidewalls of the capping pattern and protrude higher than the upward faces of the first and second impurity layers, which further comprises an insulator interposed between the first and second bit lines and the protruding portions of the first and second gate lines.

The insulator can be at least one surface insulation layer formed on the protruding portions of the first and second gate lines adjacent to the first and second bit lines, and insulating spacers formed on sidewalls of the openings.

At least one of the first and second gate lines can be configured to receive a voltage providing attraction for charges stored in the channel region.

The semiconductor device can further comprise a capacitor conductively connected to the channel region.

The semiconductor device can further comprise: an upper interlevel insulation film covering the substrate; and a buried contact plug penetrating the upper interlevel insulation film and the insulating line pattern in sequence and contacting to the channel region. The capacitor can include a bottom electrode connected to the buried contact plug on the upper interlevel insulation film, a dielectric film covering the bottom electrode, and a top electrode disposed on the dielectric film.

The semiconductor device can further comprise a buried spacer interposed between the buried contact plug and the first and second bit lines.

According to another aspect of the invention, provided is a method of fabricating a semiconductor device. The method includes: forming a fin having first and second sidewalls opposite to each other on a substrate; forming a first gate line on the first sidewall of the fin in the shape of a spacer; forming a second gate line on the second sidewall of the fin in the shape of a spacer; forming an interlevel insulation pattern to cover the substrate and the first and the second gate lines around the fin; forming a mold insulation layer to cover the substrate; patterning the mold insulation layer to form first and second grooves that intersect the fin in parallel with being isolated from each other; forming first and second impurity layers in the fin under the first and second grooves, respectively; and forming first and second bit lines each connected to the first and second impurity layers in the first and second grooves, respectively.

The method can further comprise: forming a first multi-level insulation film interposed between the first gate line and the first sidewall of the fin and includes a first charge-trapping insulation film; and forming a second multi-level insulation film interposed between the second gate line and the second sidewall of the fin and includes a second charge-trapping insulation film.

The method can further comprise: forming a hard mask pattern that is disposed on the fin and level with the interlevel insulation pattern; and removing the hard mask pattern revealed by the first and second grooves to form first and second openings to reveal the fin under the first and second grooves respectively, wherein the first and second impurity layers are formed through implanting ionic impurities into the fin revealed by the first and second openings, wherein the first and second bit lines are formed to fill the first and second openings.

The method can include extending the first and second gate lines upward to be adjacent partially to both sidewalls of the hard mask pattern, including partially extending the first multi-level insulation film upward to be interposed between the hard mask pattern and the first gate line, and partially extending the second multi-level insulation film upward to be interposed between the hard mask pattern and the second gate line.

The method can further comprise forming insulation spacers at sidewalls of the first and second openings before forming the first and second bit lines.

Forming the first multi-level insulation film can further comprise forming a first tunnel insulation film contacting to the first sidewall of the fin and a first blocking insulation film contacting to the first gate line. And forming the second multi-level insulation film further comprise forming a second tunnel insulation film contacting to the second sidewall of the fin and a second blocking insulation film contacting to the second gate line. The method can also include interposing the first charge-trapping insulation film between the first tunnel insulation film and the blocking insulation film, and interposing the second charge-trapping insulation film between the second tunnel insulation film and blocking insulation film.

The method can include contacting a bottom of the fin with the substrate, which further comprises, before forming the first and second gate lines: forming a field isolation film covering the sidewalls of the fin and reducing the field isolation film to reveal upper portions of the sidewalls of the fin.

The fin and the first and second gate lines can be formed on a buried insulation film placed on the substrate.

The fin and the first and second gate lines can be formed on a buried insulation film placed on the substrate, wherein, the method can further comprise: forming gate insulation films between the first gate line and the first sidewall of the fin and between the second gate line and the second sidewall of the fin. Then, the bottoms of the first and second impurity layers can contact with the buried insulation film, and a channel region between the first and second impurity layers is floated to be used as a data storage field.

The method can further comprise: forming a hard mask pattern that is disposed on the fin and level with the interlevel insulation pattern; and removing the hard mask pattern revealed by the first and second grooves to form first and second openings to reveal the fin under the first and second grooves respectively, wherein the first and second impurity layers are formed through implanting ionic impurities into the fin revealed by the first and second openings, and wherein the first and second bit lines are formed to fill the first and second openings along with the first and second grooves.

The method can comprise extending the first and second gate lines upward to be adjacent partially to both sidewalls of the hard mask pattern, which can further comprise: forming an insulator interposed between the first and second bit lines and the extending portions of the first and second gate lines.

The method can further comprise: forming an upper interlevel insulation film to cover the substrate; forming buried contact holes that penetrate the upper interlevel insulation film and the mold insulation layer in sequence and reveal the channel region; forming buried contact plugs to fill the buried contact holes; forming a bottom electrode connected to the buried contact plug on the upper interlevel insulation film; forming a dielectric film on the bottom electrode; and forming a top electrode on the dielectric film.

The method can include forming the buried contact holes at both sidewalls of the first and second bit lines in self-alignment, which further comprises: forming buried insulation spacers on sidewalls of the buried contact holes before forming the buried contact plugs.

A further understanding of the nature and advantages of the inventions herein can be realized by reference to the remaining portions of the specification and the attached drawings.

BRIEF DESCRIPTION OF THE DRAWINGS

Various aspects of the invention will become more apparent in view of the attached drawing figures, which are provided by way of example, not by way of limitation, wherein like elements are represented by like reference numerals, which are given by way of illustration only and thus do not limit the example embodiments of the present invention, wherein:

FIGS. 6A through 10A are sectional views illustrating processing steps for fabricating the semiconductor device according to the first embodiment of the invention, taken along with I-I' of FIG. 1;

FIGS. 6B through 10B are sectional views illustrating processing steps for fabricating the semiconductor device according to the first embodiment of the invention, taken along with II-II' and III-III' of FIG. 1;

FIGS. 17A through 20A are sectional views illustrating processing steps for fabricating the semiconductor device according to the second embodiment of the invention, taken along with V-V' of FIG. 11;

FIGS. 17B through 20B are sectional views illustrating processing steps for fabricating the semiconductor device according to the second embodiment of the invention, taken along with VI-VI' and VII-VII' of FIG. 11;

FIGS. 21A through 23A are sectional views illustrating processing steps for fabricating the semiconductor device shown in FIG. 14, taken along with VIII-VIII' of FIG. 14; and FIGS. 21B through 23B are sectional views illustrating processing steps for fabricating the semiconductor device shown in FIG. 14, taken along with IX-IX' and X-X' of FIG. 14.

DETAILED DESCRIPTION OF PREFERRED EMBODIMENTS

Figure 1:
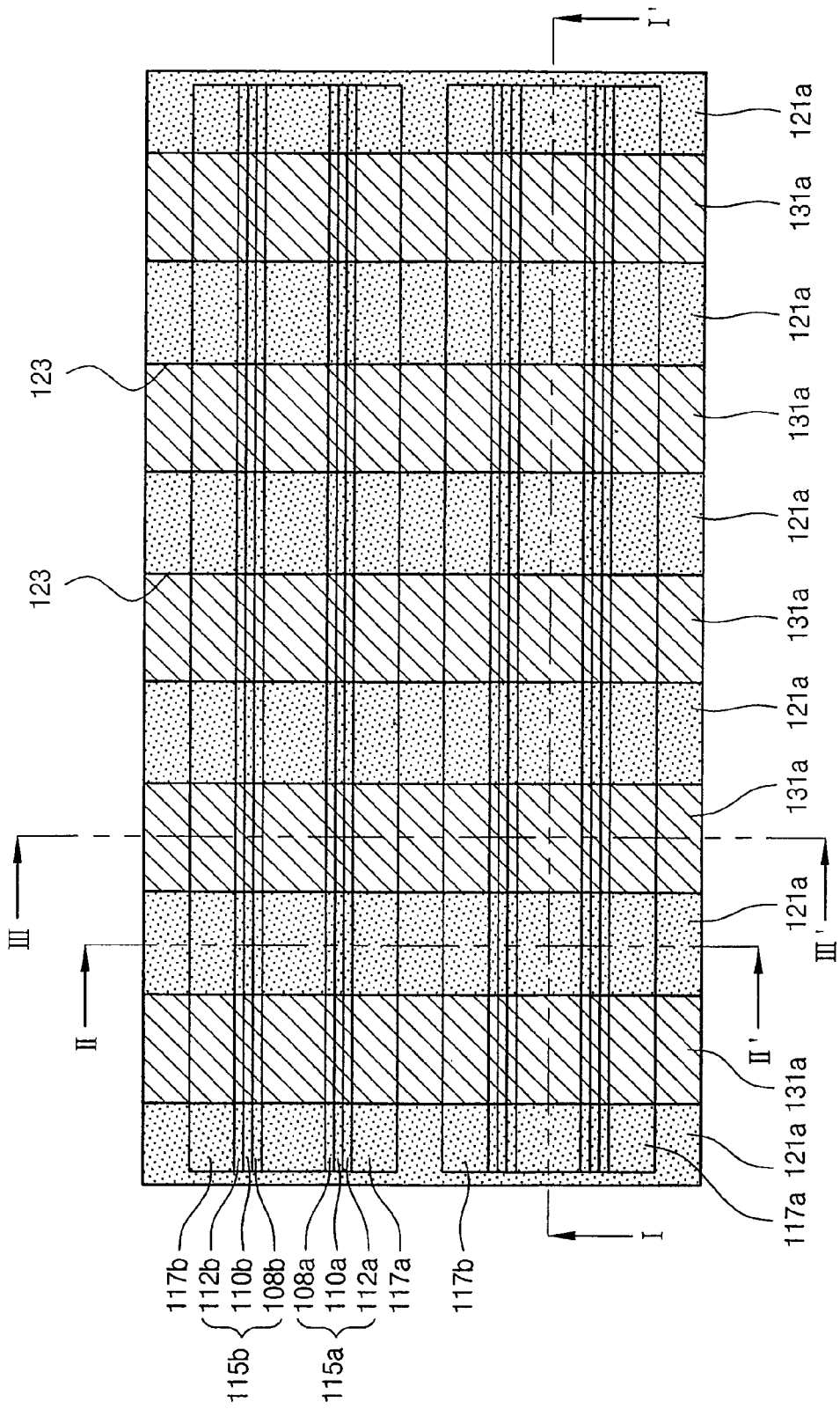
FIG. 1 is a plan view illustrating a first embodiment of a semiconductor device in accordance with an aspect of the invention.

Preferred embodiments of the present invention will be described below in more detail with reference to the accompanying drawings. The present invention can, however, be embodied in different forms and should not be constructed as limited to the embodiments set forth herein.

In the figures, the dimensions of layers and regions are exaggerated for clarity of illustration. It will also be understood that when a layer (or film) is referred to as being 'on' another layer or substrate, it can be directly on the other layer or substrate, or intervening layers can also be present. Further, it will be understood that when a layer is referred to as being 'under' another layer, it can be directly under, and one or more intervening layers can also be present. In addition, it will also be understood that when a layer is referred to as being 'between' two layers, it can be the only layer between the two layers, or one or more intervening layers can also be present. Like reference numerals refer to like elements throughout the specification.

Figure 2:
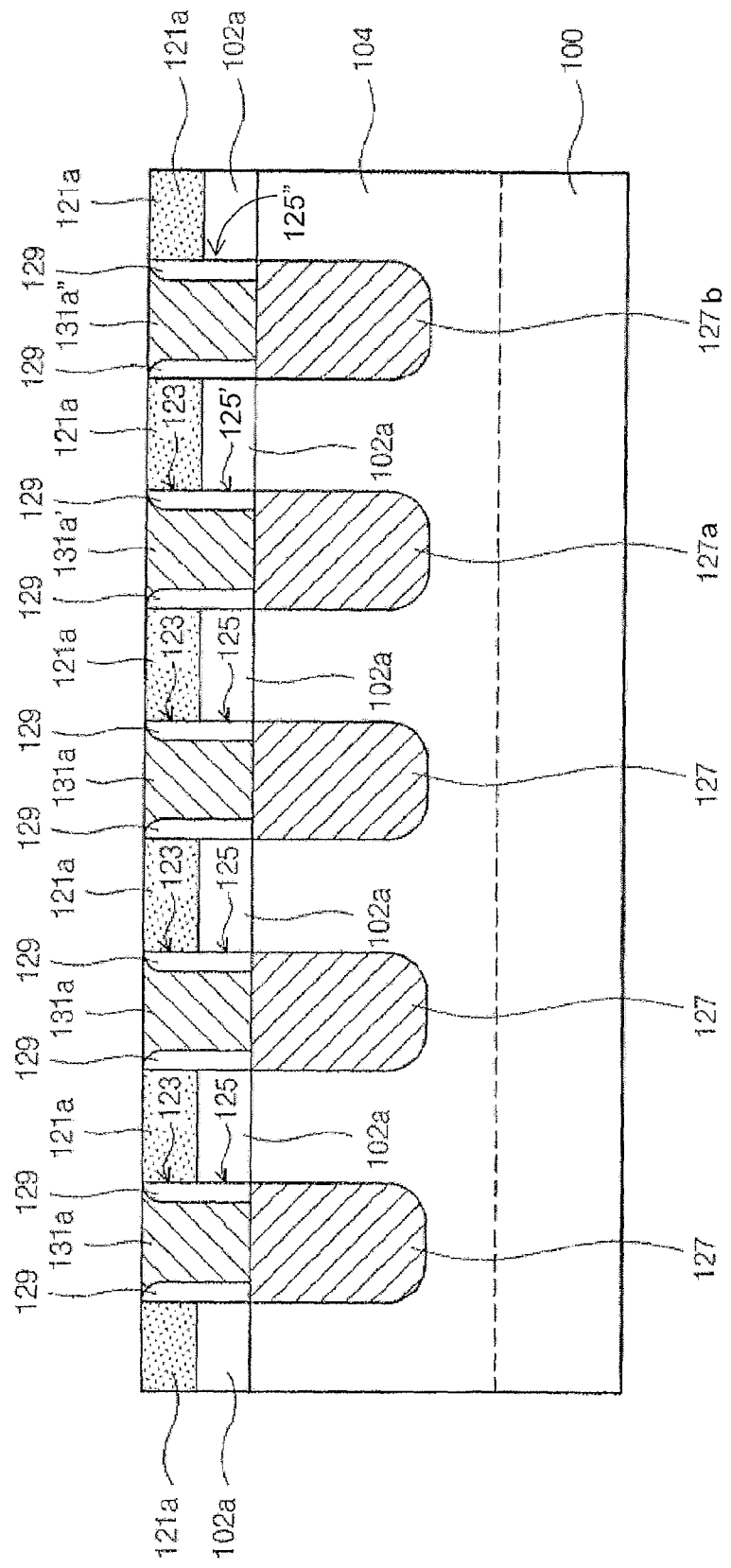
FIG. 2 is a sectional view taken along with I-I' of FIG. 1.
Figure 3:
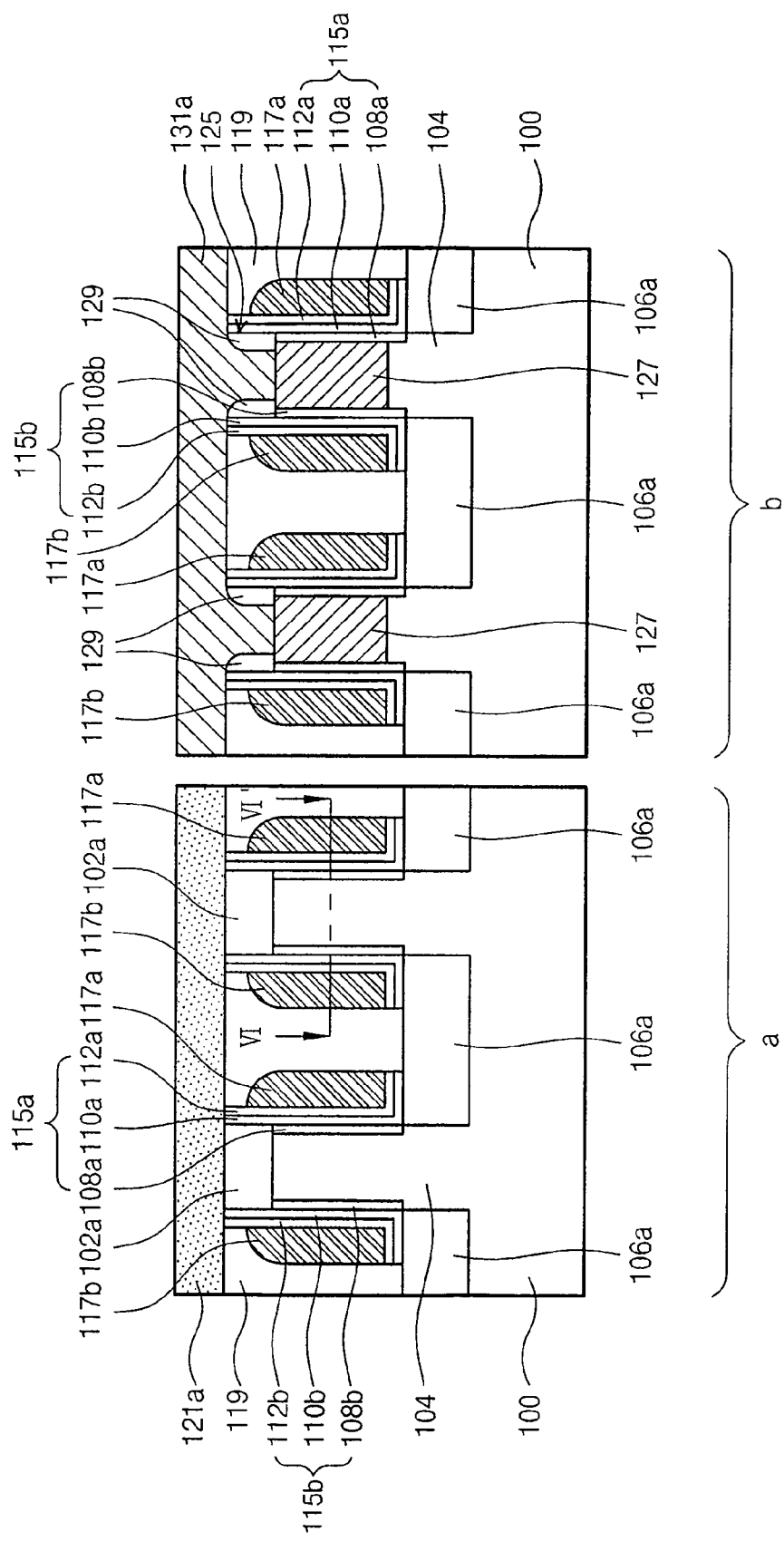
FIG. 3 illustrates sections taken along with II-II' and III-III' of FIG. 1.
Figure 4:
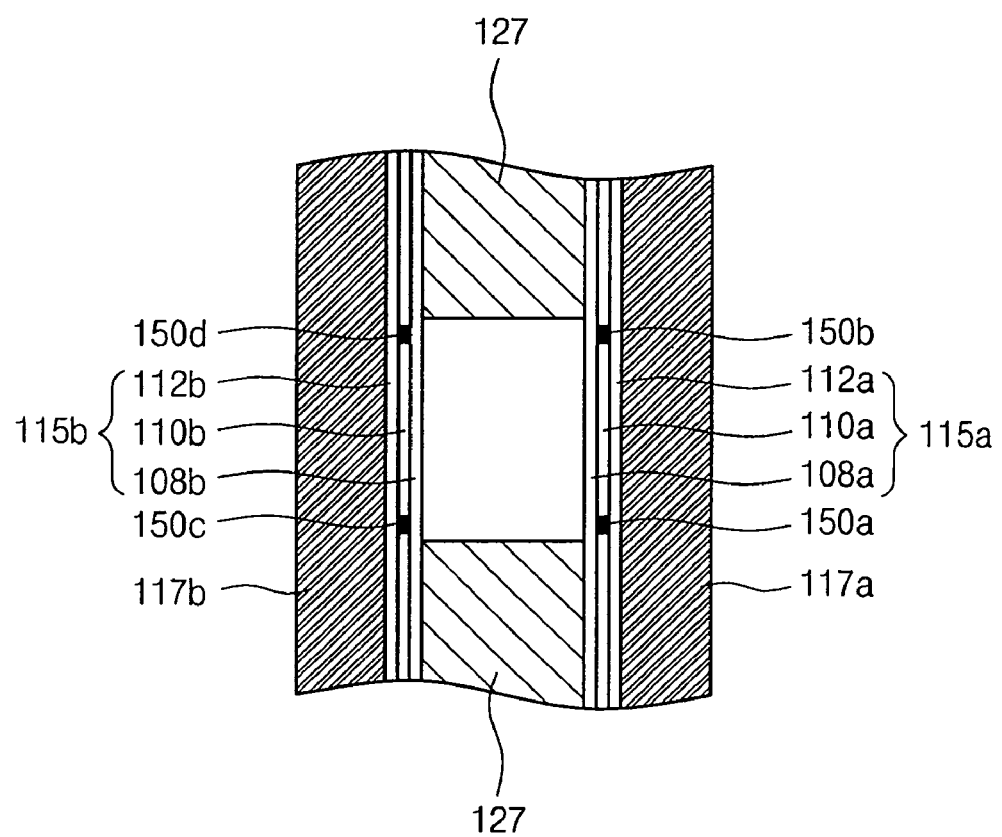
FIG. 4 is a plan view partially enlarging the semiconductor device on view of the section IV-IV' of FIG. 1.

FIG. 1 is a plan view illustrating a first embodiment of a semiconductor device in accordance with an aspect of the invention. FIG. 2 is a sectional view taken along with I-I' of FIG. 1, and FIG. 3 illustrates sections taken along with II-II' and III-III' of FIG. 1. FIG. 4 is a plan view partially enlarging the semiconductor device on view of the section IV-IV' of FIG. 1. In FIG. 3, reference letters 'a' and 'b' denote portions corresponding to the sections respective to II-II' and III-III' of FIG. 1, respectively.

Referring to FIGS. 1, 2, and 3, pluralities of fins 104 are uniformly arranged along a predetermined direction (i.e., the row direction in FIG. 1) on a substrate 100. The fins 104 are isolated from each other by a predetermined distance in this embodiment. The fin 104 is comprised of first and second sidewalls, which are opposite to each other. The fins 104 are shaped in linear forms on a plane. Bottom sides of the fins 104, as illustrated, can contact with the substrate 100. The substrate 100 can be a silicon substrate, as an example. The fins 104 are formed of a semiconductor material. For example, the fins 104 can be made of silicon, as with the substrate 100.

Field isolation films 106a cover the substrate 100 between the fins 104. The field isolation films 106a also cover lower portions of the sidewalls of the fins 104. Namely, the field isolation films 106 are disposed lower than the fins 104, and the upper portion of the fins 104 protrude higher than the field isolation film 106a. The field isolation film 106a can be formed of silicon oxide, as an example.

First gate lines 117a are disposed on the first sidewalls of the fins 104, while second gate lines 117b are disposed on the second sidewalls of the fins 104. The first and second gate lines 117a and 117b are arranged in parallel rows. In other words, the first and second gate lines 117a and 117b are parallel with the fins 104. The first and second gate lines 117a and 117b are preferably formed in the structure of spacers on the first and second sidewalls of the fin 104, being symmetrical to each other. The first and second gate lines 117a and 117b are disposed on the field isolation film 106a. The first and second gate lines 117a and 117b can extend upward to have protruding portions higher than the top of the fin 104. Namely, the first and second gate lines 117a and 117b can entirely cover the first and second sidewalls of the fin 104. The first and second gate lines 117a and 117b can correspond with word lines formed in the semiconductor. The first and second gate lines 117a and 117b are formed of a conductive film. For instance, the first and second gate lines 117a and 117b can be formed from one or more among doped polysilicon, metal (e.g., tungsten or molybdenum), conductive metal nitride (e.g., titanium nitride or tantalum nitride), and metal silicide (e.g., tungsten silicide or cobalt silicide).

First multi-level insulation film 115a is interposed between the first gate line 117a and the first sidewall of the fin 104. Second multi-level insulation films 115b is interposed between the second gate line 117b and the second sidewall of the fin 104. The first multi-level insulation film 115a is comprised of a first tunnel insulation film 108a contacting with the first sidewall of the fin 104, a first blocking insulation film 112a contacting with the first gate line 117a, and a first charge-trapping insulation film 110a interposed between the first tunnel insulation film 108a and the first blocking insulation film 112a. The second multi-level insulation film 115b is comprised of a second tunnel insulation film 108b contacting with the second sidewall of the fin 104, a second blocking insulation film 112b contacting with the second gate line 117b, and a second charge-trapping insulation film 110b interposed between the second tunnel insulation film 108b and the second blocking insulation film 112b.

The first multi-level insulation film 115a partially extends upward to cover a sidewall of the protruding portion of the first gate line 117a. Namely, the extending portion of the first multi-level insulation film 115a is adjacent to the sidewall of the protruding portion of the first gate line 117a. The first charge-trapping and blocking insulation films 112a and 110a of the first multi-level insulation films 115a can extend upward to cover the sidewall of the protruding portion of the first gate line 117a. Similarly, the second multi-level insulation film 115b partially extends upward to cover a sidewall of the protruding portion of the second gate line 117b. Namely, the extending portion of the second multi-level insulation film 115b is adjacent to the sidewall of the protruding portion of the second gate line 117b. And the second charge-trapping and blocking insulation films 112b and 110b of the second multi-level insulation film 115b can extend upward to cover the protruding sidewall of the second gate line 117b. Further, a bottom portion of the first multi-level insulation film 115a can laterally extend to be interposed between the first gate line 117a and the field isolation film 106a. A bottom portion of the second multi-level insulation film 115b can laterally extend to be interposed between the second gate line 117b and the field isolation film 106a.

The first and second charge-trapping insulation films 110a and 110b include an insulation (or dielectric) material having deep level traps in which charges are trapped. For instance, the first and second charge-trapping insulation films 110a and 110b are formed of silicon nitride, or an insulation material containing pluralities of nano-crystals. These nano-crystals can be made of a semiconductor such as silicon or germanium, as examples. The first and second tunnel insulation films 108a and 108b can be formed of silicon oxide, specifically, thermal oxide. The first and second tunnel insulation films 108a and 108b can be formed having substantially the same thickness and from the same material. The first blocking insulation film 112a can be made of silicon oxide. If made of silicon oxide, the first blocking insulation film 112a can be thicker than the first tunnel insulation film 108a. Otherwise, the first blocking insulation film 112a can contain a dielectric material with a higher dielectric constant than the first tunnel insulation film 108a, e.g., a metallic oxide such as hafnium oxide or aluminum oxide. The second blocking insulation film 112b can be also formed of silicon oxide. In this case, the second blocking insulation film 112b can be thicker than the second tunnel insulation film 108b. Differently, the second blocking insulation film 112b can contain a dielectric material with a higher dielectric constant than the second tunnel insulation film 108b, e.g., a metallic oxide such as hafnium oxide or aluminum oxide. The first and second blocking insulation films 112a and 112b can be formed having substantially the same thickness and from the same material.

In each of the fins 104, pluralities of impurity layers 127 are disposed, while being isolated from each other by a predetermined interval. The plural impurity layers 127 are arranged along the row direction. A couple of the impurity layers 127, adjacent to each other, define a channel region in the fin 104 between the first and second gate lines 117a and 117b. The impurity layer 127 can be comprised of a first sidewall arranged on the first sidewall of the fin 104, a second sidewall arranged on the second sidewall of the fin 104, and an upward face arranged at the top face of the fin 104. In detail, the first sidewall of the impurity layer 127 meets with the first sidewall of the fin 104 at the same face, while the second sidewall of the impurity layer 127 meets with the second sidewall of the fin 104 at the same face. The upward face of the impurity layer 127 is level with the top face of the fin 104. The channel region is also comprised of a first sidewall arranged on the first sidewall of the fin 104, a second sidewall arranged on the second sidewall of the fin 104, and an upward face arranged at the top face of the fin 104. Namely, the first and second sidewalls and upward face of the channel region meet with the first and second sidewalls and top face of the fin 104 in the same plane, respectively.

As aforementioned, the first and second gate lines 117a and 117b are formed to cover the first and second sidewalls of the fin 104, respectively. In detail, the first gate line 117a covers the first sidewall of the channel region and the first sidewall of the impurity layer 127, while the second gate line 117b covers the second sidewall of the channel region and the second sidewall of the impurity layer 127. The first multi-level insulation film 115a is further interposed between the impurity layer 127 and the first gate lines 117a, while the second multi-level insulation film 115b is further interposed between the impurity layer 127 and the second gate line 117b.

A unit cell of the semiconductor device can include the couple of adjacent impurity layers 127, and the channel region formed between the adjacent impurity layers 127. The unit cell can further includes the first multi-level insulation film 115a and the first gate line 117a that cover the first sidewalls of the adjacent impurity layers 127 and the channel region, and the second multi-level insulation film 115b and the second gate line 117b that cover the second sidewalls of the adjacent impurity layers 127 and the channel region. One of the adjacent impurity layers 127 corresponds with a first source/drain region of the unit cell, while the other corresponds with a second source/drain region of the unit cell. The impurity layer 127 corresponding to the first source/drain region is defined as first impurity layer 127a, while the other impurity layer 127 corresponding to the second source/drain region is defined as second impurity layer 127b in FIG. 2. In the fin 104, pluralities of the unit cells are arranged and connected with each other in series. In this structure, the first and second impurity layers 127a and 127b included in the unit cell are shared by other unit cells adjacent thereto at both sides thereof.

Interlevel insulation patterns 119 cover the first and second gate lines 117a and 117b, and the substrate 100 around the fins 104. The top faces of the interlevel insulation patterns 119 are placed higher than the top faces of the fins 104. The interlevel insulation patterns 119 can be placed higher than the top faces of the fins 104. But, the interlevel insulation patterns 119 do not cover the fins 104.

Pluralities of bit lines 131a intersect the fins 104 in parallel. The bit lines 131a further cross over the first and second gate lines 117a and 117b. The bit lines 131a are disposed on the interlevel insulation patterns 119. The bit lines 131a are isolated from each other in a predetermined interval. Each bit lines 131a covers the impurity layer 127, being connected to the upward face of the impurity layer 127. The plural bit lines 131a are connected to the upward faces of the plural impurity layers 127 formed in the unit fin 104, respectively. And, each bit line 131a is connected with the upward faces of the impurity layers 127 arranged along one column direction in the plane of FIG. 1.

The bit lines 131a are formed of a conductive film. For instance, the bit lines 131a can be formed with at least one of doped polysilicon, metal (e.g., tungsten or molybdenum), conductive metal nitride (e.g., titanium nitride or tantalum nitride), and metal silicide (e.g., tungsten silicide or cobalt silicide).

In this specification, the bit lines 131a connected with the first impurity layers 127a, described above, are defined as first bit lines 131a', while the bit lines 131a connected with the second impurity layers 127b are defined as second bit lines 131a". Similar to the first and second impurity layers 127a and 127b, the first and second bit lines 131a' and 131a" of the unit cell are also shared by other unit cells adjacent thereto at both sides thereof.

Insulating line patterns 121a are each disposed between the first and second bit lines 131a' and 131a" adjacent to each other. The insulating line patterns 121a cover the channel regions and intersect the fins 104. The insulating line patterns 121a also cross over the first and second gate lines 117a and 117b. The insulating line patterns 121a are arranged in parallel over the substrate 100, corresponding each with the plural channel regions formed in the fin 104. Spaces between the insulating line patterns 121a adjacent to each other form grooves 123. The grooves 123 are filled with the bit lines 131a. Here, it is preferred to level the top faces of the insulating line pattern 121a with the top faces of the bit lines 131a.

A capping pattern 102a is interposed between the insulating line pattern 121a and the upward face of the channel region. The top face of the capping pattern 102a can be level with the top face of the interlevel insulation pattern 119. The protruding portions of the gate lines 117a and 117b, higher than the fin 104, are partially adjacent to sidewalls of the capping pattern 102a. The bit line 131a fills an opening 125 enclosed by the interlevel insulation patterns 119 and the sidewalls of the adjacent capping patterns 102a. The bottom of the opening 125 corresponds to the upward face of the impurity layer 127. Accordingly, the bit line 131a are connected with the upward face of the impurity layer 127 through the openings 125. The openings 125 are disposed at both sides of the insulating line patterns 121a. Here, the opening 125 filled with the first bit line belonging to the unit cell is defined as a first opening 125', while the other opening filled with the second bit line belonging to the unit cell is defined as a second opening 125". The first and second multi-level insulation films 115a and 115b can partially extend closer to the top faces of the capping patterns 102a. In this structure, sidewalls of the openings 125 can be made up with the sidewalls of the capping patterns 102a and the extending portions of the multi-level insulation films 115a and 115b.

The insulating line patterns 121a are preferably made of an insulation material having etching selectivity to the interlevel insulation patterns 119. For instance, the interlevel insulation patterns 119 can be formed of silicon oxide, while the insulating line pattern 121a can be formed of silicon nitride. The capping patterns 102a are preferred to comprise an insulation material having substantially the same etching selectivity with the insulating line patterns 121a. For example, the capping patterns 102 can include silicon nitride.

Insulating spacers 129 can be placed on the sidewalls of the openings 125. In this structure, the bit lines 131a fill up the openings 125 between the insulating spacers 129. In other words, the insulating spacer 129 and the extending portions of the multi-level insulation films 115a and 115b are interposed between the bit line 131a and the protruding portions of the gate lines 117a and 117b. The insulating spacer 129 can extend to be interposed between the insulating line pattern 121a and the bit line 131a. The insulating spacer 129 can be formed of silicon oxide or silicon nitride films, as examples.

The semiconductor device with the aforementioned structure is a nonvolatile memory device in which a data bit is stored in at least one of the first and second charge-trapping insulation films 110a and 110b. With reference to the magnification of the unit cell, as shown in FIG. 4, an operation of the nonvolatile memory device will be described.

Continuing with reference to FIGS. 1, 2, 3, and 4, the unit cell includes the first and second impurity layers 127 isolated from each other, and the channel region confined between the first and second impurity layers 127. The first charge-trapping insulation film 110a located by the first sidewall of the channel region is comprised of a first region 150a adjacent to the first impurity layer 127 and a second region 150b adjacent to the second impurity layer 127. The first and second regions 150a and 150b are isolated from each other. In FIG. 4, the first impurity layer 127 is placed at the lower side while the second impurity layer 127 is placed at the upper side. The second charge-trapping insulation film 110b located by the second sidewall of the channel region is comprised of a third region 150c adjacent to the first impurity layer 127, and a fourth region 150d adjacent to the second impurity layer 127.

At least one among the first, second, third, and fourth regions 150a, 150b, 150c, and 150d, respectively, is used for a data storage field. In other words, the unit cell is able to have one or more data storage fields. Thus, the unit cell can store one or multiple data bits.

The channel region includes the first and second sidewalls thereof within its width. A part formed along the first sidewall of the channel region is referred to as a first channel, while the other part formed along the second sidewall of the channel region is referred to as a second channel.

Now, a more detailed description of the feature and operation of the unit cell in accordance with the number and position of the data storage field will be provided. The following description proceeds with the assumption that: the channel region is doped with P-type impurities; the first and second impurity layers 127 are doped with N-type impurities; and charges stored in the data storage field are electrons.

When one of the regions 150a, 150b, 150c, and 150d is used as the data storage field, the unit cell is able to store one data bit. For instance, the case where the first region 150a is assigned to the data storage field will be described for illustrative purposes. Once electrons are stored in the first region 150a, the first channel adjacent to the first region 150a is set to a first threshold voltage. Otherwise, if the first region 150a does not have electrons, the first channel adjacent to the first region 150a is set to a second threshold voltage. The first threshold voltage is higher than the second threshold voltage. The 1-bit data is differentiated from a difference between the first and second threshold voltages. In this case, reading data from the unit cell is accomplished by applying a sensing voltage, which has an intermediate level between the first and second threshold voltages, to the first gate line 117a. Accordingly, the first channel is turned on or off in accordance with presence of charges in the first region 150a and a data bit is read out from detecting an amount of current flowing between the first and second impurity layers 127. During this, the second gate line 117b can be supplied with a voltage capable of turning on or off the second channel, but this voltage is lower than the sensing voltage. During the read operation, it is preferred to apply the sensing voltage to the first impurity layer 127 adjacent to the data storage field and to apply a positive voltage to the second impurity layer 127.

In a case of using two of the regions 150a-150d as the data storage fields, the unit cell is able to store two data bits. The unit cell storing two data bit (hereinafter, referred to as '2-bit cell') can be configured with having first and second types. The first type of the 2-bit cell is designed such that two data storage fields are disposed between the channel region and one of the gate lines. The second type of the 2-bit cell is designed such that one of the two data storage fields is disposed between the channel region and the first gate line 117a while the other is disposed between the channel region and the second gate line 117b. The first and second types of the 2-bit cell can be operable in different features, as follows.

First, it will be detailed about the first type of the 2-bit cell in the case that the first and second regions 150a and 150b are assigned to the two data storage fields. As aforementioned, the first channel adjacent to the first region 150a is charged with the first or second threshold voltage in accordance with presence of electrons in the first region 150a. Also, the first channel adjacent to the second region 150b is charged with the first or second threshold voltage in accordance with presence of electrons in the second region 150b. With this condition, it is able to implement the 2-bit cell by independently controlling the 1-bit data of the first and second regions 150a and 150b.

In programming the first-type 2-bit cell, electrons, which are hot carriers generated from the channel region adjacent to the first impurity layer 127, are injected into the first region 150a. Otherwise, the second region 150a accepts electrons that are hot carriers generated from the channel region adjacent to the second impurity layer 127. Next, the way of independently reading data bits from the first and second regions 150a and 150b will be explained. First, in reading a data bit from the first region 150a independent of the second region 150b, a sensing voltage, a ground voltage, and a positive voltage are applied to the first gate line 117a, the first impurity layer 127, and the second impurity layer 127, respectively. The positive voltage applied to the second impurity layer 127 extends to a depletion layer adjacent to the second impurity layer 127, which causes the first channel to be depleted adjacent to the second region 150b. Thus, it is possible to read a data bit from the first region 150a without being affected by a data bit of the second region 150b. Next, in reading a data bit from the second region 150b independent of the first region 150a, a sensing voltage, a positive voltage, and a ground voltage are applied to the first gate line 117a, the first impurity layer 127, and the second impurity layer 127, respectively. Thus, the positive voltage applied to the first impurity layer 127 causes the first channel to be depleted adjacent to the first region 150a. Therefore, it is possible to read a data bit from the second region 150b without being affected by a data bit of the first region 150a. In this case, the second gate line 117b can be supplied with a voltage equal to the sensing voltage, capable of turning on or off the second channel.

Now, the second type of the 2-bit cell, as an example where the first and third regions 150a and 150c are assigned to the two data storage fields, will be described. In this case, the 2-bit cell is able to have first, second, third, or fourth states. The first state is referred to as being a condition where electrons are all stored in the first and third regions 150a and 150c. The second state is referred to as being a condition where there is no electron in the first and third regions 150a and 150c. The third state is referred to as being a condition where electrons are stored in the first region 150a not in the third region 150c. The fourth state is referred to as being a condition where electrons are stored in the third region 150c not in the first region 150a. The electrons are injected into the first and third regions 150a and 150c. In order to inject the electrons into the first region 150a, a gate voltage is applied to the first gate line 117a while a turn-off voltage is applied to the second gate line 117b. On the contrary, in order to inject the electrons into the third region 150c, a gate voltage is applied to the second gate line 117b while a turn-off voltage is applied to the first gate line 117a.

Read operations of the second-type 2-bit cell in accordance with the first, second, third, and fourth states will now be explained. First, in a first read operation, sensing voltages are applied to the first and second gate lines 117a and 117b. During the first read operation, it is permissible to apply the ground voltage and a positive voltage, respectively, to the first and second impurity layers 127. If the second-type 2-bit cell is conditioned in the first state, during the first read operation, the first and second channels are turned off to block a current flow between the first and second impurity layers 127. Otherwise, if the second-type 2-bit cell is conditioned in the second state, during the first read operation, the first and second channels are all turned on to make a current flow between the first and second impurity layers 127 large. On the other hand, if the second-type 2-bit cell is conditioned in the third or fourth state, during the first read operation, one of the first and second channels is turned off, while the other is turned on. Accordingly, the channel region is scaled down to a half (½) in width. As a result, in the two-type 2-bit cell, the third or fourth state requires a turn-on current that is larger than in the second state. Through the first read operation, it is able to differentiate the first, second, and the third (or fourth) state from the second-type 2-bit cell. After confirming that the second-type 2-bit cell is being conditioned in the third or fourth state through the first read operation, a second read operation begins. In the second read operation, a sensing voltage is applied to one of the first and second gate lines 117a and 117b while a channel turn-off voltage is applied to the other of the gate lines. The channel turn-off voltage is a voltage for absolutely shutting off the channel without regard to whether electrons are present in the data storage field. For instance, the channel turn-off voltage can be the ground voltage. As an example, the second read operation when the sensing and channel turn-off voltages are applied each to the first and second gate lines 117a and 117b will be described. If the 2-bit cell is conditioned in the third state, during the second read operation, the first and second channels are turned off to block a current flow between the first and second impurity layers 127. Otherwise, if the second-type 2-bit cell is conditioned in the fourth state, during the first read operation, the first channel is turned on while the second channel is turned off, permitting a current flow between the first and second impurity layers 127.

When the unit cell uses all the regions, 150a-150d, as the data storage fields, it is able to store and write 4-bit data in and from the unit cell. In other words, the unit cell is able to store the 4-bit data therein by combining the four regions 150a-150d, each of which stores 1-bit data. Namely, the four data bits (i.e., 4-bit data) stored in the unit cell are differentiated by conducting 4-times the read operations in which appropriate voltages are applied to the first and second gate lines 117a and 117b. A way of reading out the 4-bit data from the unit cell is accomplished using the manners for reading the 2-bit data or using a back bias effect provided to the channel region.

Electrons staying in the data storage field of the unit cell can be erased by means of Fowler-Nordheim (FN) tunnel mechanism. Otherwise, the electrons in the data storage field can be erased through injecting holes into the data storage field by means of hot carrier injection.

According to the nonvolatile memory device with the aforementioned structure, the channel region of the unit cell is formed in the fin 104. At both sides of the fin 104, the first and second gate lines 117a and 117b are disposed in the shape of spacers. The first and second gate lines 117a and 117b are supplied with predetermined voltages different from each other. The controllability of the gate lines 117a and 117b to the channel region is thus enhanced. As a result, the short channel effect is minimized to offer convenience in implementing a nonvolatile memory device suitable for higher integration.

Moreover, as aforementioned, the above structure is able to provide a nonvolatile memory device capable of storing multi-bit data (or multiple data bits) by means of the first and second gate lines 117a and 117b and the first and second charge-trapping insulation films 110a and 110b. As a result, it is possible to implement very highly integrated nonvolatile memory device.

Figure 5:
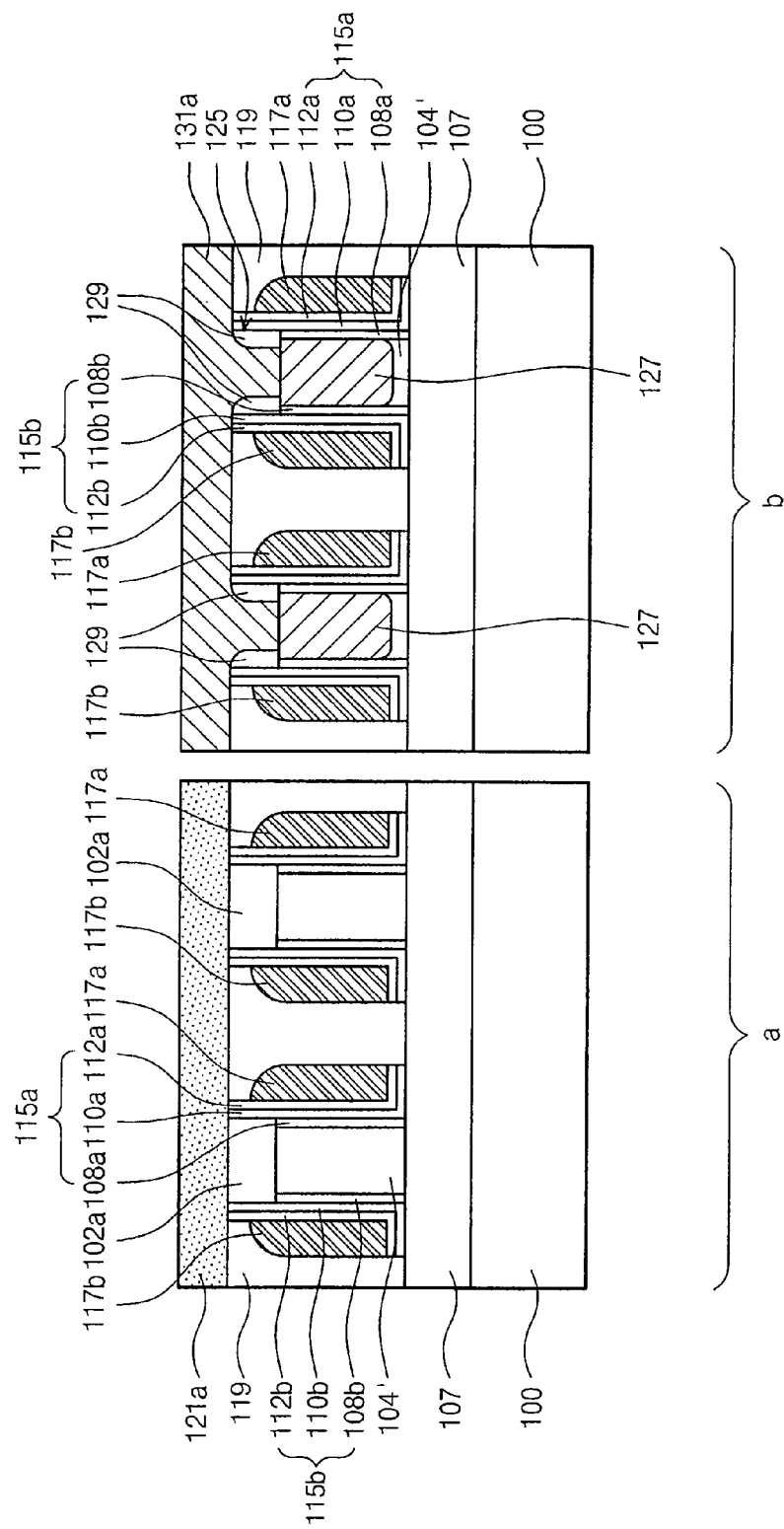
FIG. 5 illustrates sections taken along with II-II' and III-III' of FIG. 1, explaining a modification of the semiconductor device in accordance with the first embodiment of the invention.

An embodiment with a modification of the nonvolatile memory device above is illustrated in FIG. 5. As will be evident in FIG. 5, beyond the modified feature, the nonvolatile memory device of FIG. 5 is similar to the former nonvolatile memory device. Therefore, the discussion of FIG. 5 will focus on the modified portions therein.

FIG. 5 illustrates the nonvolatile memory device with sections taken along with II-II' and III-III' of FIG. 1, from which the modification of the semiconductor device relative to the first embodiment of the invention will be evident.

Referring to FIG. 5, a buried insulation film 107 is interposed between fins 104' and the substrate 100. The buried insulation film 107 can entirely cover the substrate 100. Here, the first and second gate lines 117a and 117b are disposed on the buried insulation film 107. The buried insulation film 107 is configured to provide field isolation in the device. With the buried insulation film 107, there is no need for the field isolation films 106a of the prior embodiment, as shown in FIG. 3.

The downward faces of the impurity layers 127 confining the channel regions can contact with the top face of the buried insulation film 107. In this structure, electrons held in the first or/and second charge-trapping insulation films 110a and 110b can be released therefrom by means of hot carrier injection with holes. Otherwise, as illustrated in FIG. 5, the downward faces of the impurity layers 127 can be isolated from the top face of the buried insulation film 107. In this case, electrons held in the first and/or second charge-trapping insulation films 110a and 110b can be removed therefrom by means of FN tunneling mechanism, for example.

FIGS. 6A through 10A are sectional views illustrating processing steps for fabricating the semiconductor device according to the first embodiment of the invention, taken along with I-I' of FIG. 1, and FIGS. 6B through 10B are sectional views illustrating processing steps for fabricating the semiconductor device according to the first embodiment of the invention, taken along with II-II' and III-III' of FIG. 1.

Figure 6A:
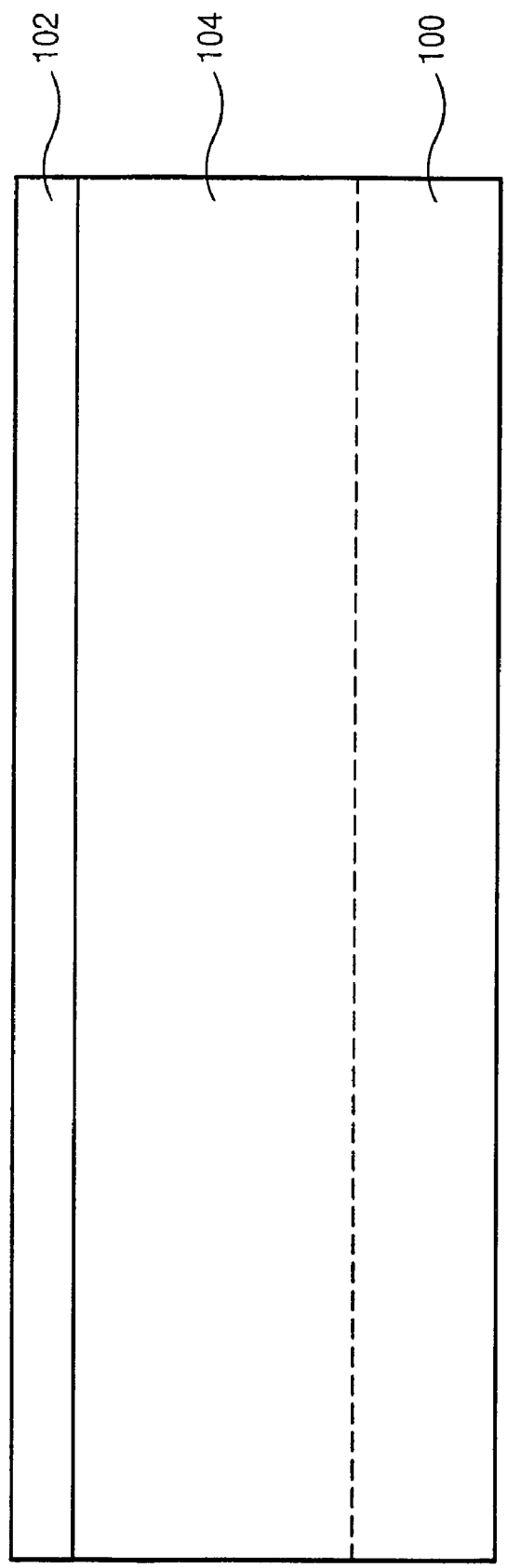
Figure 6B:
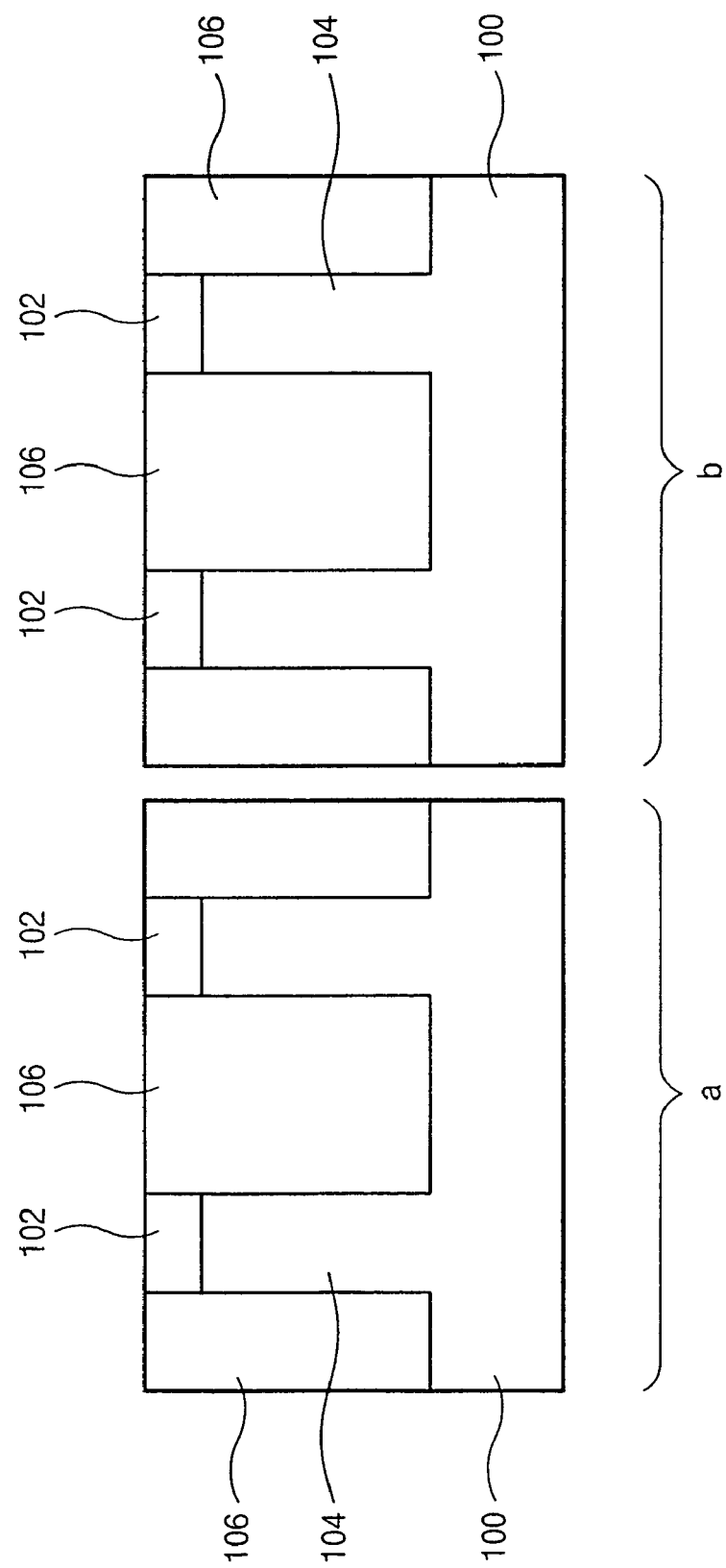

Referring to FIGS. 6A and 6B, hard mask patterns 102 are formed in parallel and at a predetermined interval on the substrate 100. The hard mask patterns 102 are arranged in parallel along the row direction of FIG. 1, as is shown in FIG. 6A. The hard mask patterns 102 can be formed in the shape of lines on a plane. The hard mask patterns 102 can include an insulation material, e.g., silicon nitride, having etching selectivity relative to the substrate 100.

Referring to FIG. 6B, using the hard mask pattern 102 as a mask, the substrate 100 is selectively etched to form the fins 104. Under the hard mask patterns 102, pluralities of the fins 104 are formed in parallel on the substrate 100. Each fin 104 has first and second sidewalls.

Thereafter, an insulation film 106 is deposited to fill up spaces around the fins 104 and over the substrate 100. The insulation film 106 can be reduced or flattened to reveal the hard mask patterns 102. The reduced insulation film 106 can be made of an insulation material, e.g., silicon oxide, having etching selectivity relative to the hard mask patterns 102.

Figure 7A:
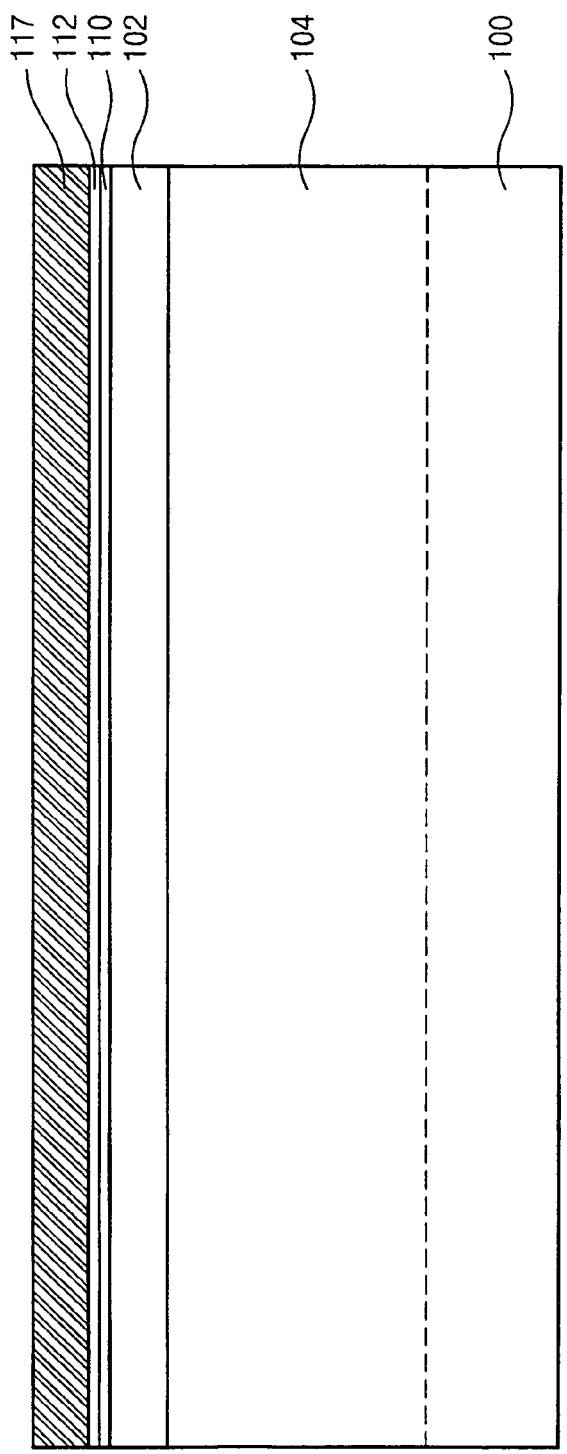
Figure 7B:
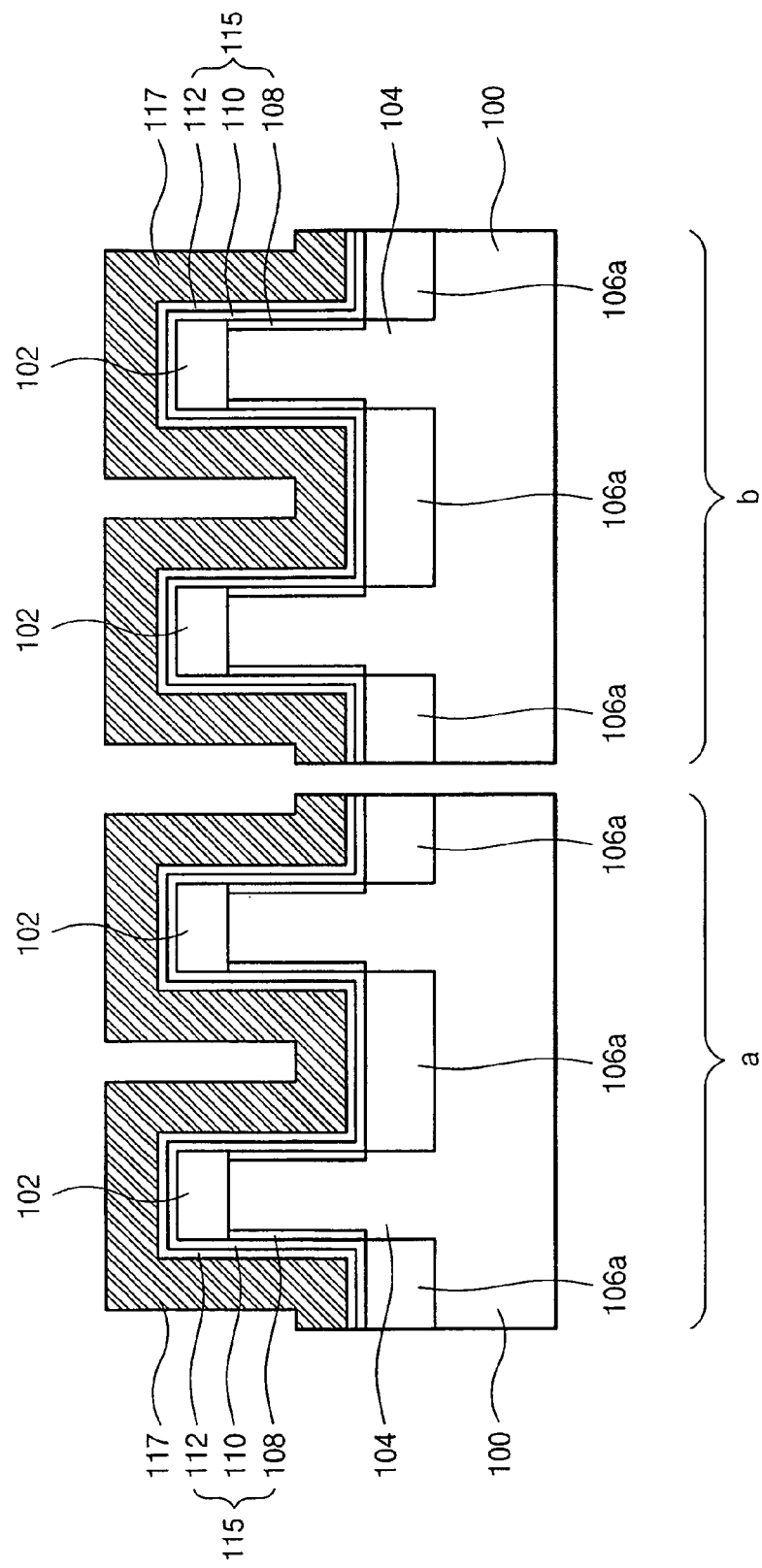

Next, referring to FIGS. 7A and 7B, FIG. 7A shows the charge-trapping insulation film 110, blocking insulation film 112, and conductive gate film 117 formed on hard mask layer 102. As is shown in FIG. 7B, the reduced insulation film 106 is selectively recessed to form the field isolation films 106a covering the lower sidewalls of the fins 104. The multi-level insulation film 115 is conformably formed on the substrate 100, and the films disposed thereon. The multi-level insulation film 115 comprises the tunnel insulation film 108, the charge-trapping insulation film 110, and the blocking insulation film 112 those are stacked thereon in sequence. The tunnel insulation film 108 can be made of thermal oxide, for example. Thus, the tunnel insulation film 108 can be formed on the sidewalls of the fins 104. The charge-trapping insulation film 110 and the blocking insulation film 112 can be formed by means of chemical vapor deposition or atomic layer deposition, as examples. Thus, the charge-trapping insulation film 110 and the blocking insulation film 112 cover the top faces and both sides of the hard mask patterns 102. And, a conductive gate film 117 is conformably deposited on the multi-level insulation film 115.

Figure 8A:
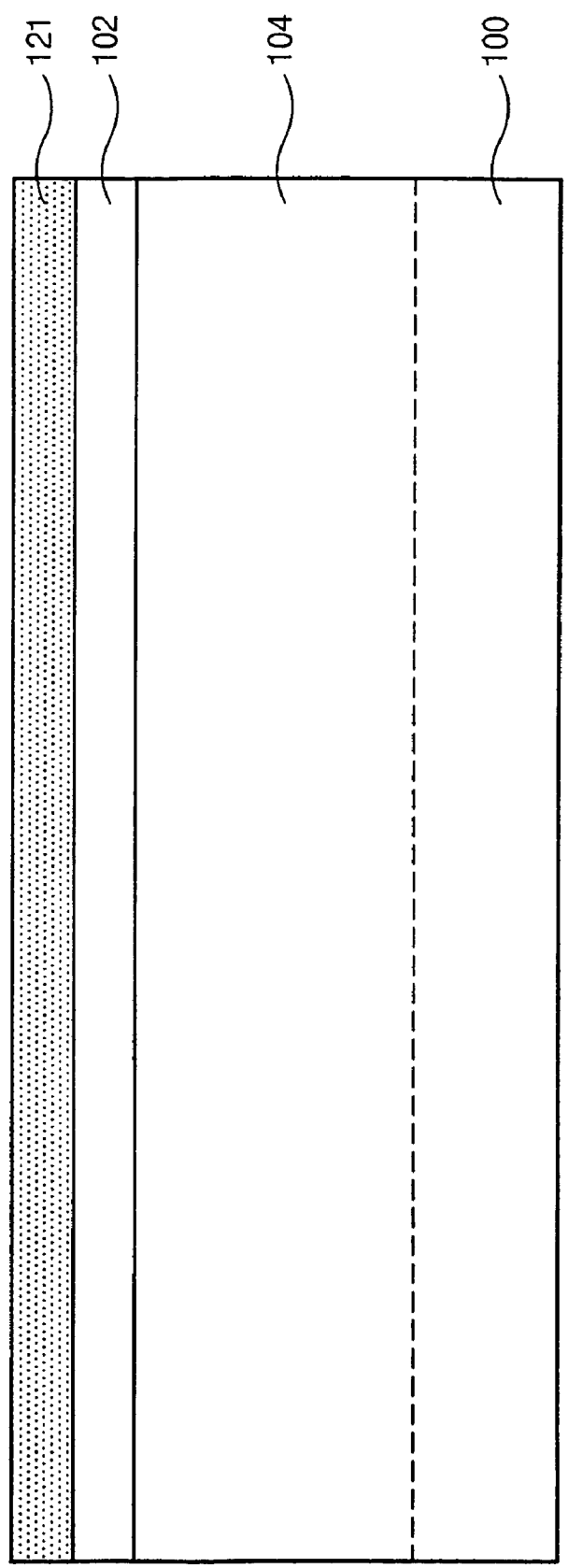

Now referring to FIGS. 8A and 8B, the conductive gate film 117 is anisotropically etched to form the first gate lines 117a, which are disposed on the first sidewalls of the fins 104 in the shape of spacers, and the second gate lines 117b which are disposed on the second sidewalls of the fins 104 in the shape of spacers. The top portions of the first and second gate lines 117a and 117b are preferred to be lower than the top faces of the hard mask patterns 102. Namely, the first and second gate lines 117a and 117b are preferred to cover lower portions of the sidewalls of the hard mask patterns 102. After completing the anisotropic etching step, there could areas where the first and second gate lines 117a and 117b are connected with each other at edges of the cell array region. In this case, it is preferred to carry out a patterning process, after the anisotropic etching step, for cutting off the connection parts between the first and second gate lines 117a and 117b.

After depositing an interlevel insulation film over the substrate 100, the interlevel insulation film, the blocking insulation film 112, and the charge-trapping insulation film 110 are reduced until the top faces of the hard mask patterns 102 are revealed, for example by a planarization process. This planarization process results in interlevel insulation patterns 119 that cover the substrate 100, the field isolation films 106a, and the gate lines 117a and 117b, around the fins 104. From the planarization process, the top faces of the interlevel insulation patterns 119 are preferably level with the top faces of the hard mask patterns 102. The planarization process can separate the multi-level insulation films 115 from each other. Thereby, the first multi-level insulation films 115a are interposed between the first gate lines 117a and the fins 104, while the second multi-level insulation films 115b are interposed between the second gate lines 117b and the fins 104.

The first and second multi-level insulation films 115a and 115b are parts of the multi-level insulation film 115. Each of the first multi-level insulation films 115a includes the first tunnel insulation film 108a, the first charge-trapping insulation film 110a, and the first blocking insulation film 112a stacked in sequence on the first sidewall of the fin 104, while each of the second multi-level insulation films 115b includes the second tunnel insulation film 108b, the second charge-trapping insulation film 110b, and the second blocking insulation film 112b stacked in sequence on the second sidewall of the fin 104. The first charge-trapping and blocking insulation films 110a and 112a are interposed between the interlevel insulation films 119 and sidewalls of the hard mask patterns 102, while the second charge-trapping and blocking insulation films 110b and 112b are interposed between the interlevel insulation films 119 and the other sidewalls of the hard mask patterns 102.

Thereafter, a mold insulation layer 121 is deposited over the substrate 100, and the films formed thereon, as shown in FIGS. 8A and 8B. The mold insulation layer 121 is preferably made of an insulation material having etching selectivity relative to the interlevel insulation pattern 119. The mold insulation layer 121 can be formed of an insulation material having substantially the same etching selectivity as the hard mask pattern 102, e.g., silicon nitride.

Figure 9A:
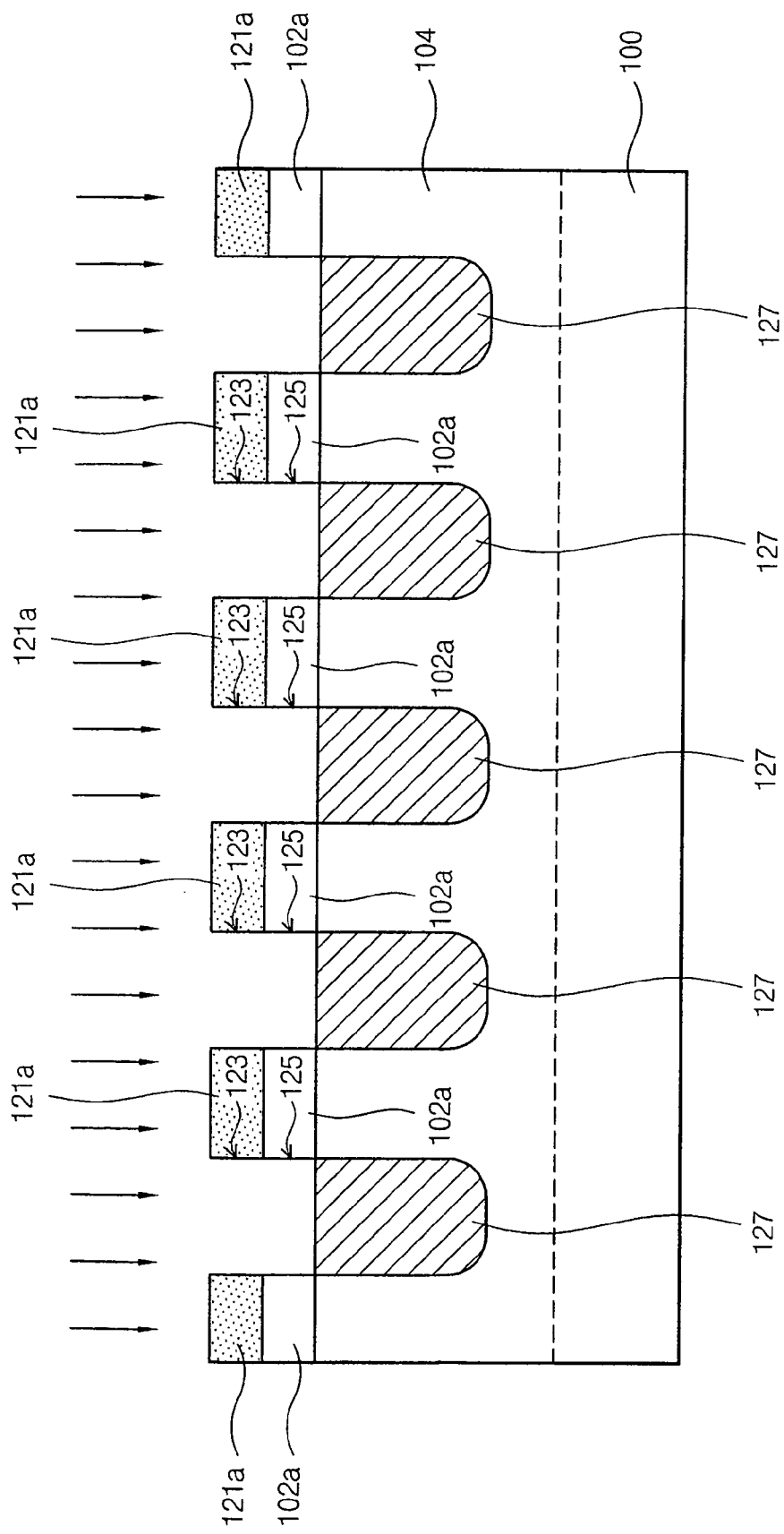
Figure 9B:
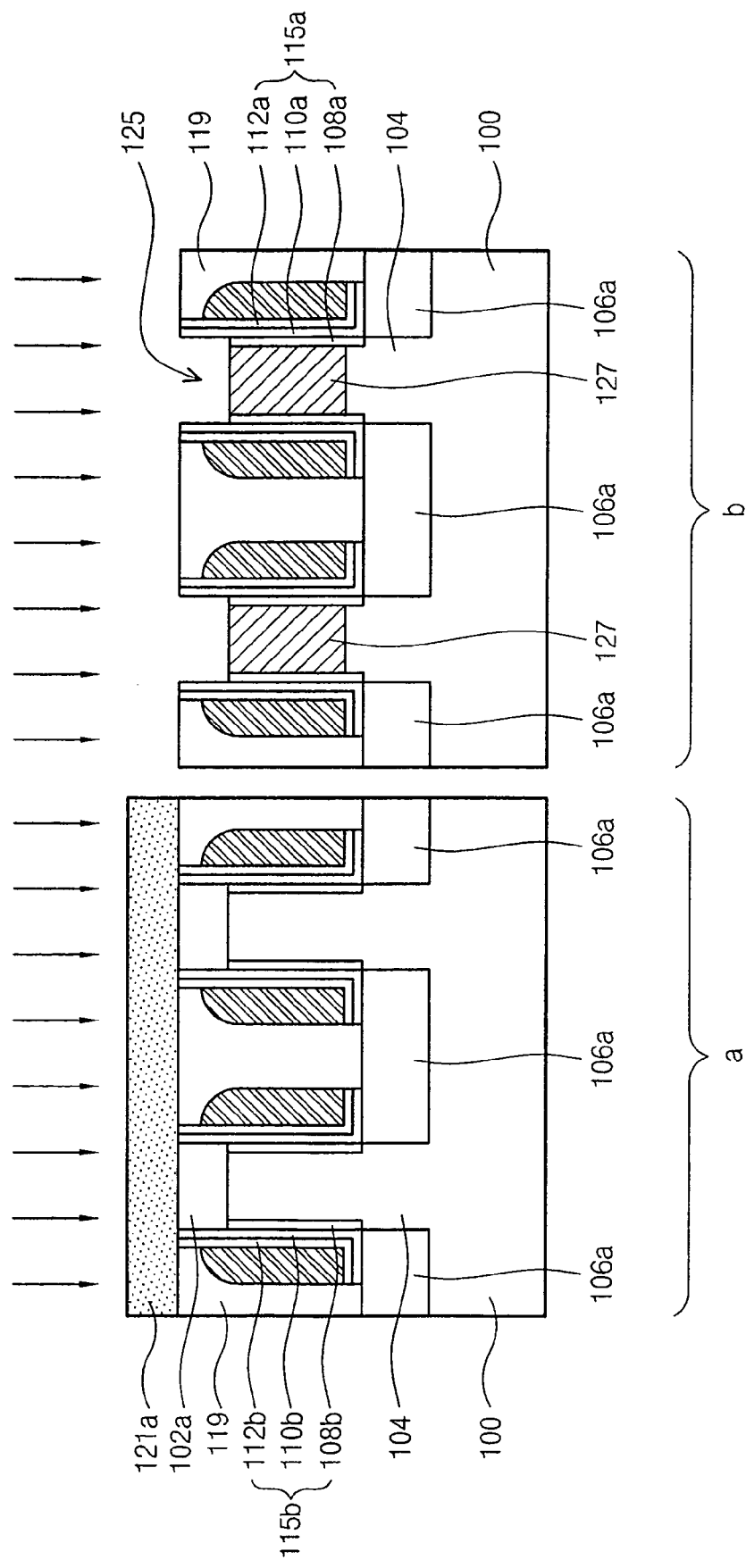

Next, referring to FIGS. 9A and 9B, the mold insulation layer 121 is patterned to form the grooves 123 intersecting the fins 104 in parallel with a predetermined interval, as in FIG. 9A. The grooves 123 partially reveal the interlevel insulation patterns 119 and the hard mask patterns 102. The patterned mold insulation layers placed between the adjacent grooves 123 are defined as the insulating line patterns 121a. The fins 104 under the insulating line patterns 121a are defined as the channel regions. That is, the insulating line patterns 121a cover the channel regions.

The hard mask patterns 102 revealed by the grooves 123 are removed to form the openings 125 that partially reveal the top faces of the fins 104. The openings 125 are formed at both sides of the insulating line patterns 121a. The mold insulation layer 121 is made of a material having substantially the same etching rate as the hard mask pattern 102. And, the hard mask pattern 102 and the mold insulation pattern 121 are formed of materials having substantially the same etching selectivity to the interlevel insulation pattern 119. From this reason, it is preferable to conduct an in-situ etching process for providing the openings 125, in this embodiment. According to this operation, the openings 125 and the grooves 123 are completed in self-alignment, without any margin of misalignment therebetween. As a result, it is possible to implement a highly integrated nonvolatile memory device.

While forming the openings 125, capping patterns 102a are formed between the insulating line patterns 121a and the top faces of the fins 104. The capping patterns 102a are parts of the hard mask patterns 102. The openings 125 are enclosed by the interlevel insulation patterns 119 and the sidewalls of the capping patterns 102a. Consequently, the sidewalls of the openings 125 can be made up with the first and second charge-trapping insulation films 110a and 110b, and the sidewalls of the capping patterns 102a.

Then, using the insulating line patterns 121a as a mask, ionic impurities are implanted into the fins 104, which are revealed by the openings 125, to form the impurity layers 127.

Figure 10A:
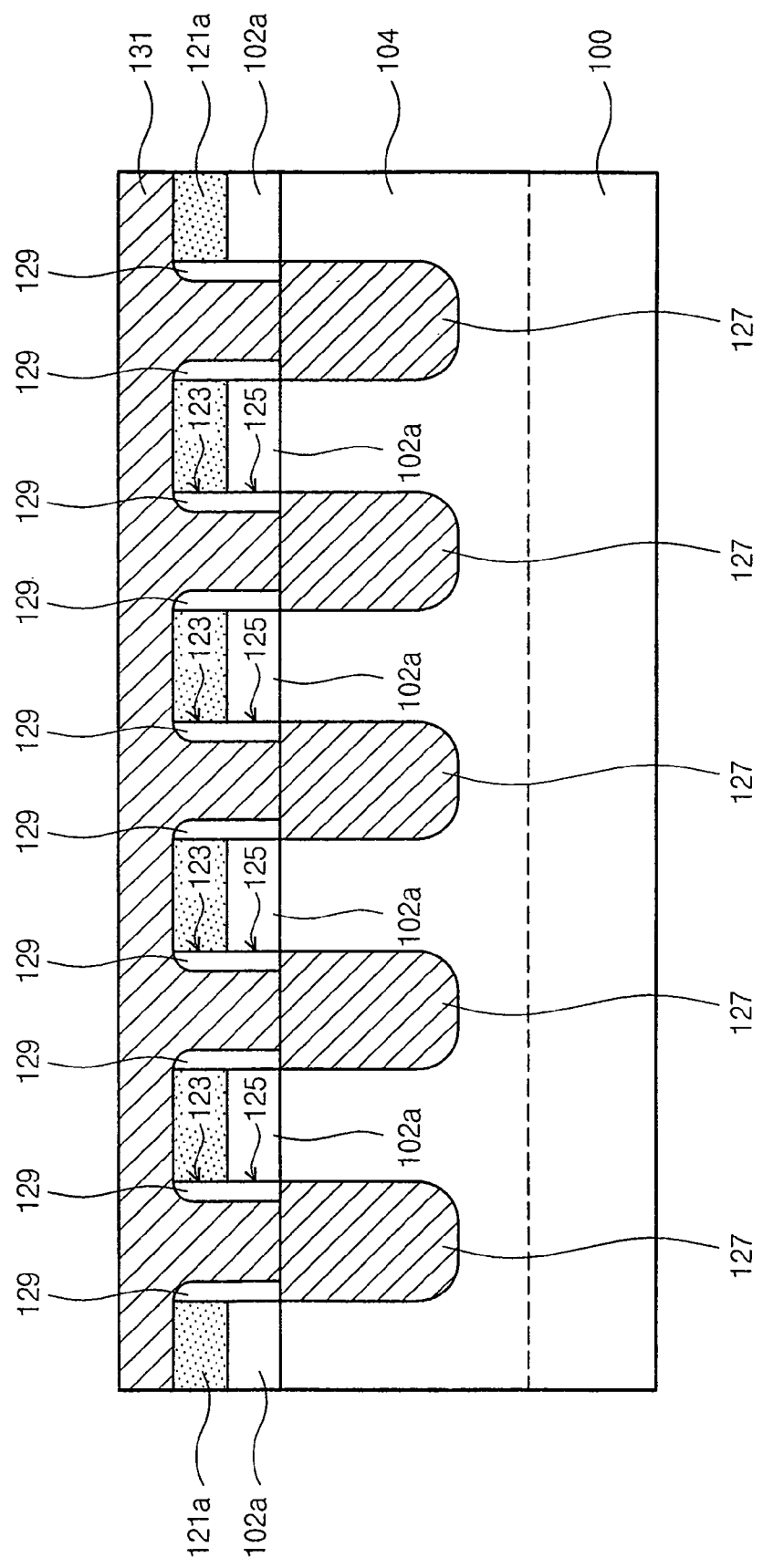
Figure 10B:
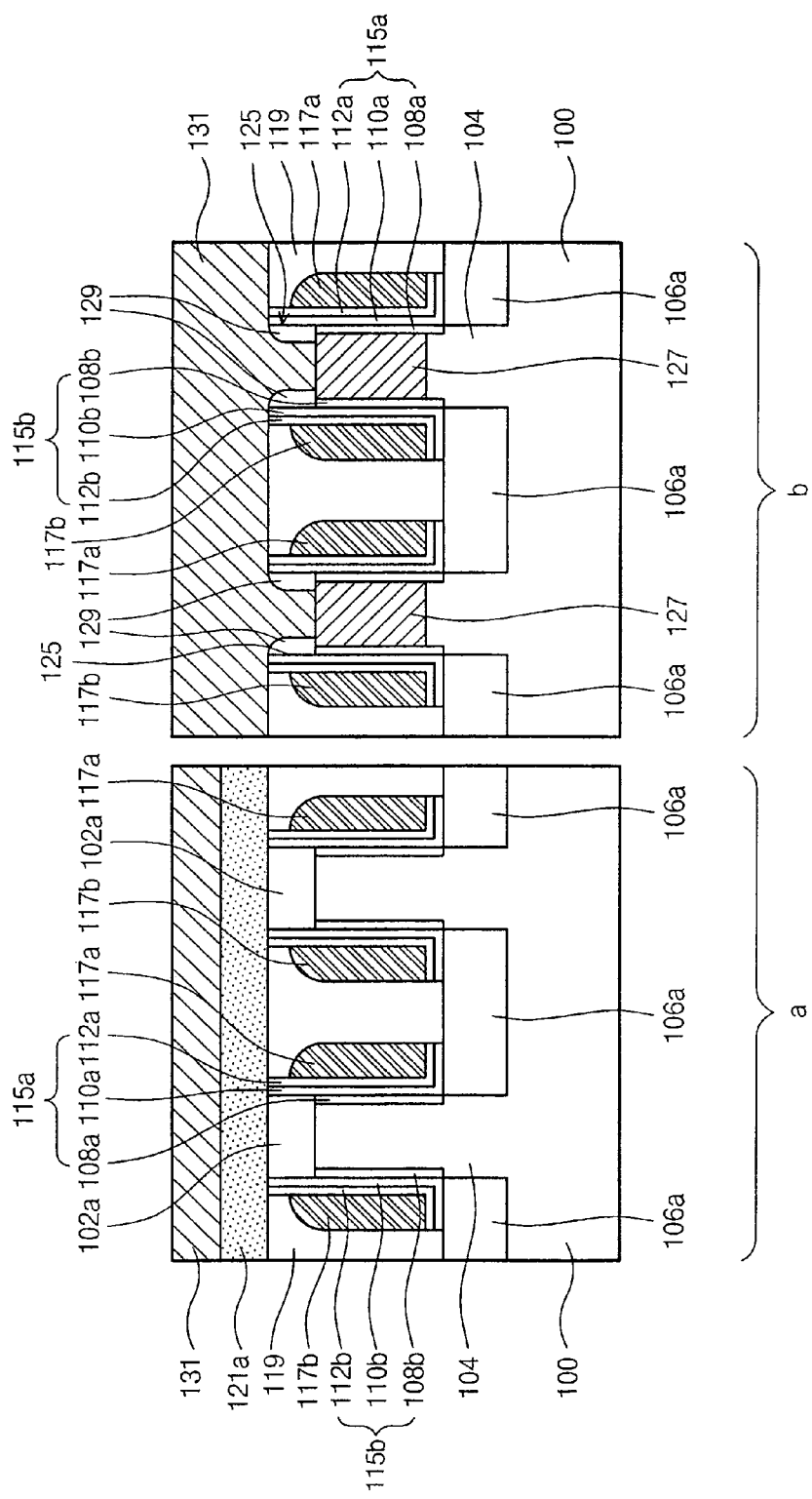

Next, referring to FIGS. 10A and 10B, the insulation spacers 129 can be formed on the sidewalls of the openings 125. The insulation spacers 129 can be formed on the sidewalls of the grooves 123. While the insulation spacers 129 are formed after completing the ion implantation to form the impurity layers 127, it is permissible to conduct the ion implantation after forming the insulation spacers 129.

A conductive bit line film 131 is deposited over the substrate 100, and the films formed thereon, filling the openings 125 and the grooves 123. The conductive bit line film 131 contacts with the impurity layers 127 revealed by the openings 125.

The conductive bit line film 131 is reduced or flattened until the top faces of the insulating line patterns 121a are revealed, forming the bit lines 131a shown in FIGS. 1, 2, and 3. From the processing step of reducing the conductive bit line film 131, the top faces of the bit lines 131a can be level with the top faces of the insulating line patterns 121a. Reducing (or planarizing) the conductive bit line film 131 can be accomplished by a chemical-mechanical polishing process. The result is the structure of the nonvolatile memory device shown in FIGS. 1, 2, and 3.

According to the aforementioned method of fabricating the nonvolatile memory device, the grooves 123 and the openings 125 for the bit lines 131a are completed in self-alignment. Thus, there is no misaligning of the bit lines 131a, the grooves 123, and the impurity layers 127 with each other. As a result, it is possible to implement a highly integrated memory device that is a nonvolatile memory device. Further, as the openings 125 are self-aligned to the grooves 123, the alignment margins are substantially zero among the impurity layers 127, the openings 125, the grooves 123, and the bit lines 131a.

Additionally, since the gate lines 117a and 117b are formed in the shape of spacers, there is no need of conducting a photolithography process for defining the width of the gate lines 117a and 117b. Thus, it is permissible for the line width of the gate lines 117a and 117b to be narrower than the minimum value F that is defined by the photolithography process. The width of the gate lines 117a and 117b can be dependent on a thickness of the conductive gate film 117. Meanwhile, the first and second impurity layers 127 are shared by adjacent unit cells. Consequently, it is possible to fabricate the unit cell in the area of $4F^2$ by making a pitch between the fins 104 set in the maximum value, arranging the gate lines 117a and 117b in an interval smaller than a half (½) of the minimum width F, and making widths of the bit lines 131a and the insulating line patterns 121a set in the minimum value F. Thus, it is possible to provide a highly integrated semiconductor memory device.

Figure 11:
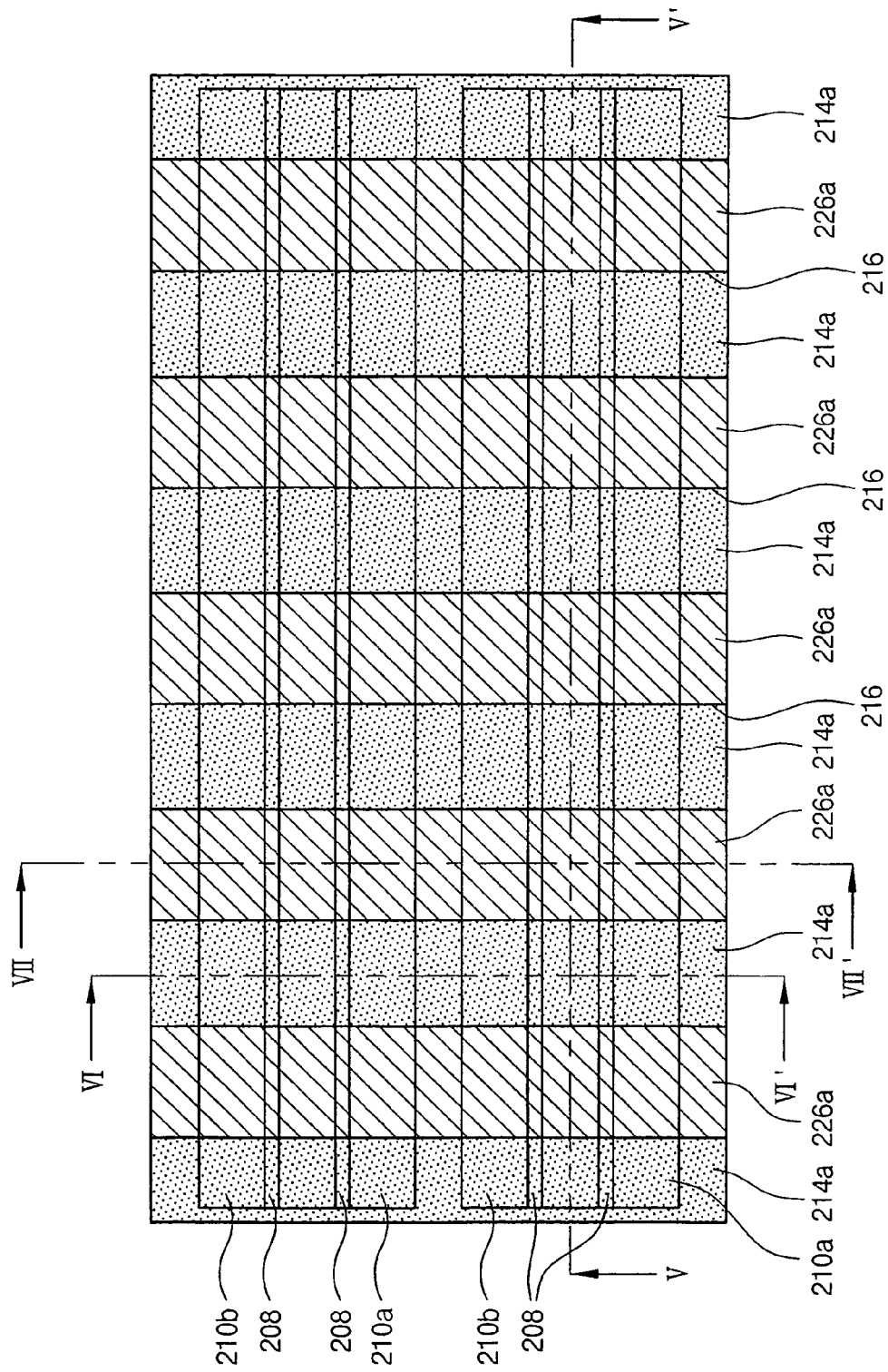
FIG. 11 is a plan view illustrating a second embodiment of a semiconductor device in accordance with aspects of the invention.
Figure 12:
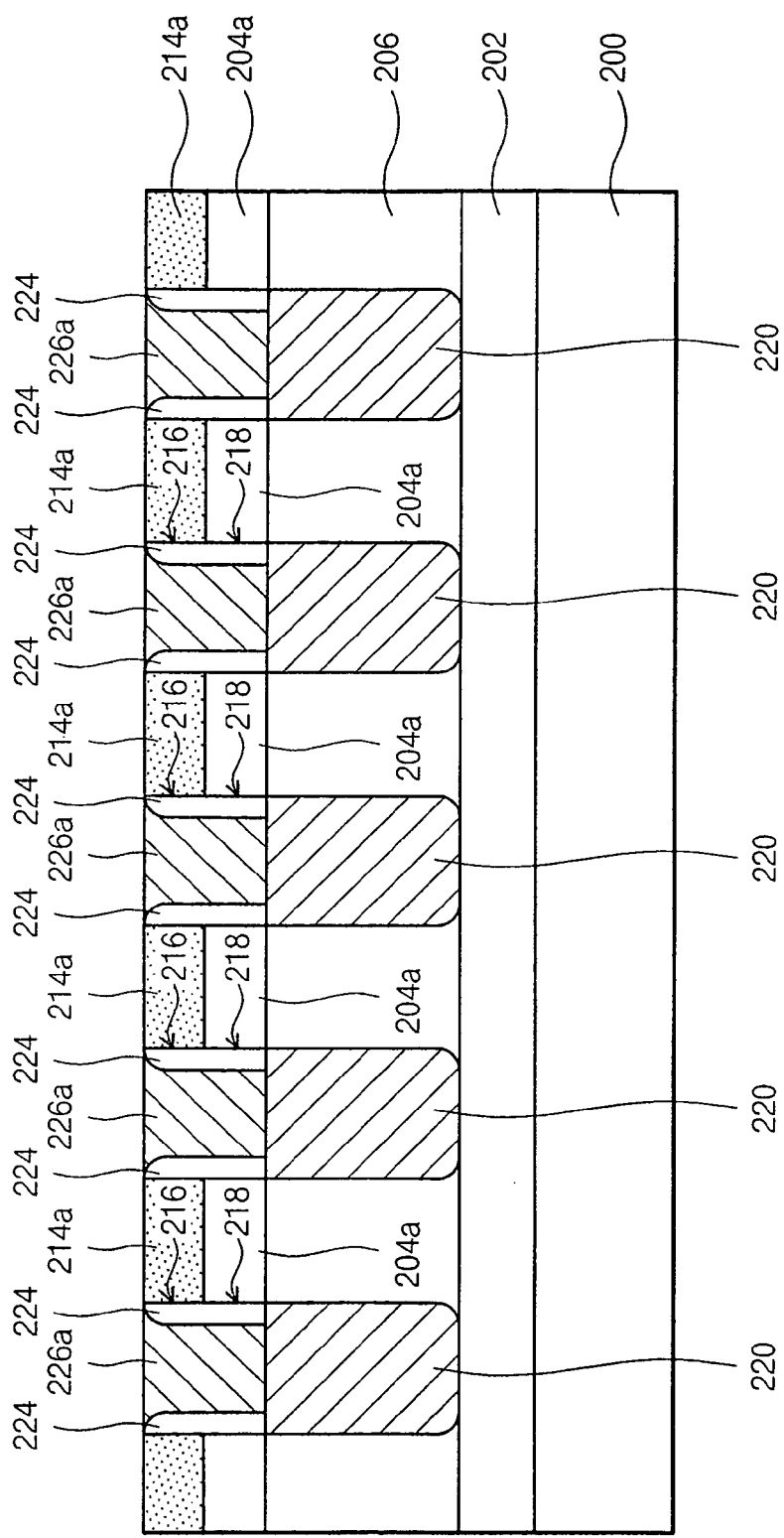
FIG. 12 is a sectional view taken along with V-V' of FIG. 11.
Figure 13:
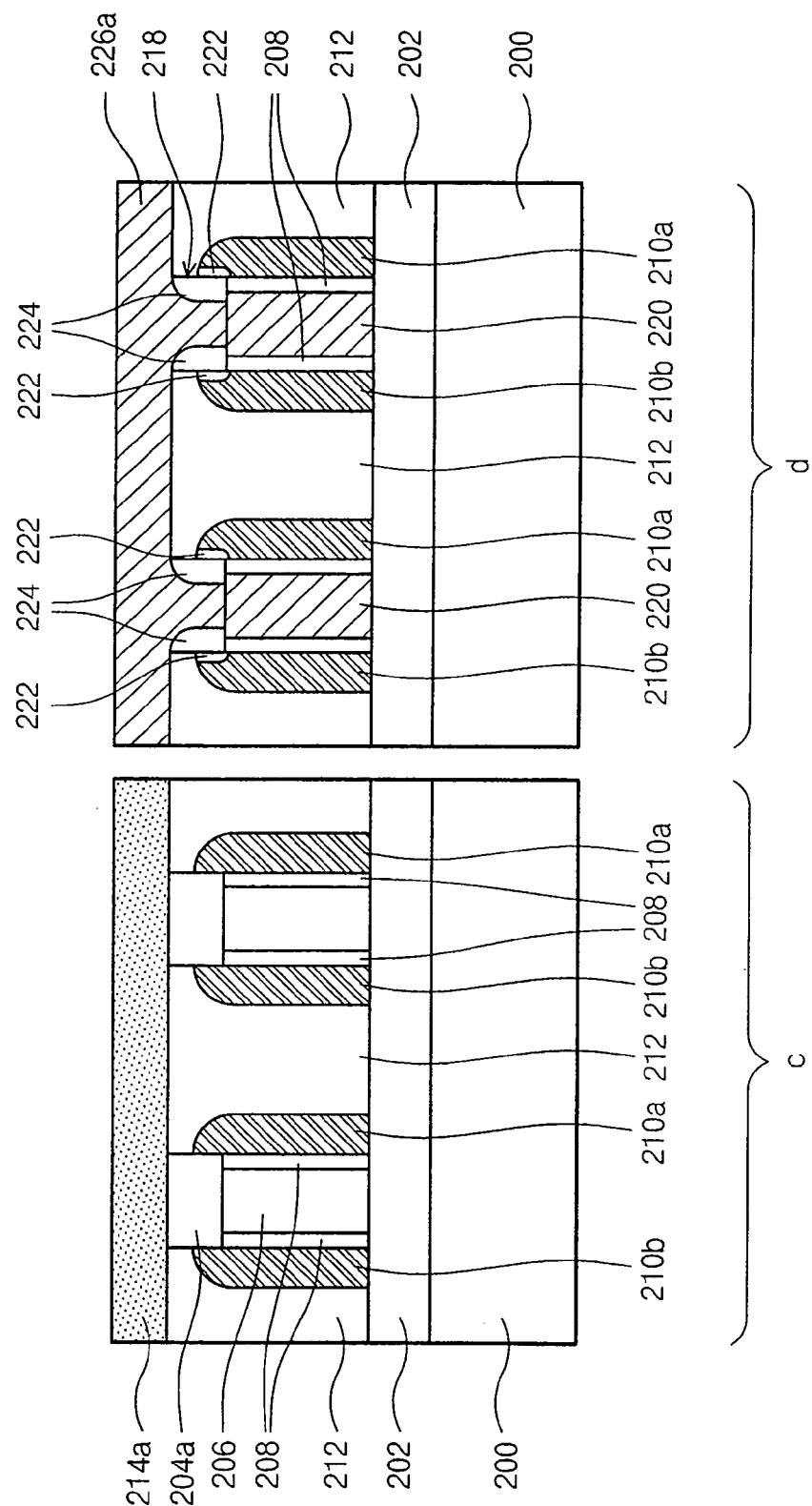
FIG. 13 illustrates sections taken along with VI-VI' and VII-VII' of FIG. 11.

In a second embodiment, provided are a semiconductor device and method of fabricating the same, suitable for high integration, according to the invention. FIG. 11 is a plan view illustrating a semiconductor device in the form of dynamic random access memory (DRAM), in accordance with the second embodiment. FIG. 12 is a sectional view taken along line V-V' of FIG. 11, and FIG. 13 illustrates sections taken along lines VI-VI' and VII-VII' of FIG. 11. In FIG. 13, reference letters 'c' and 'd' denote each to the sections respective to lines VI-VI' and VII-VII' of FIG. 11.

Referring to FIGS. 11, 12, and 13, a buried insulation film 202 is disposed on a substrate 200 and pluralities of fins 206 are uniformly arranged in a predetermined direction (i.e., the row direction in FIG. 11) on the buried insulation film 202. The fins 206 are comprised of first and second sidewalls that are opposite to each other. The buried insulation film 202 can be formed of silicon oxide, for example. The fins 206 can be made of a semiconductor material, for example, crystalline silicon.

First gate lines 210*a* are disposed on the first sidewalls of the fins 206, while second gate lines 210*b* are disposed on the second sidewalls of the fins 206. The first and second gate lines 210*a* and 210*b* are arranged in parallel rows, extending along the fins 206. The first and second gate lines 210*a* and 210*b* are preferably formed like spacers on the first and second sidewalls of the fins 206, being symmetrical to each other. The first and second gate lines 210*a* and 210*b* can extend upward to have protruding portions higher than the top face of the fin 206. The first and second gate lines 210*a* and 210*b* can correspond to word lines.

The first and second gate lines 210*a* and 210*b* are formed of a conductive film. For instance, the first and second gate lines 210*a* and 210*b* can be made to include at least one of doped polysilicon, metal (e.g., tungsten or molybdenum), conductive metal nitride (e.g., titanium nitride or tantalum nitride), and metal silicide (e.g., tungsten silicide or cobalt silicide).

Gate insulation films 208 are interposed between the first gate lines 210*a* and the first sidewalls of the fins 206, and between the second gate lines 210*b* and the second sidewalls of the fins 206. The gate insulation films 206 can be formed of silicon oxide, specifically, thermal oxide.

In each of the fins 206, pluralities of impurity layers 220 are disposed isolated from each other in a predetermined interval. A couple of the impurity layers 220, adjacent to each other, define a channel region in the fin 206 between the first and second gate lines 210*a* and 210*b*. Each of the impurity layers 220 is comprised of a first sidewall arranged on the first sidewall of the fin 206, and a second sidewall arranged on the second sidewall of the fin 206. The channel region is also comprised of a first sidewall arranged on the first sidewall of the fin 206, and a second sidewall arranged on the second sidewall of the fin 206. Upward faces of the impurity layers 220 and channel regions, meet at the top faces of the fins 206, in the same plane.

The first gate lines 210*a* cover the first sidewalls of the channel regions and impurity layers 220, while the second gate lines 210*b* cover the second sidewalls of the channel regions and impurity layers 220. In this structure, the gate insulation films 208 are interposed between the impurity layers 220 and the first gate lines 210*a*, and between the impurity layers 220 and the second gate lines 210*b*.

Interlevel insulation patterns 212 cover the first and second gate lines 210*a* and 210*b*, and the substrate 200 around the fins 206. The top faces of the interlevel insulation patterns 212 are higher than the top faces of the fins 206. The interlevel insulation patterns 212 can be higher than the top faces of the fins 206. But, the interlevel insulation patterns 212 do not cover the fins 206.

Pluralities of bit lines 226*a* intersect the fins 206 in parallel with a predetermined interval. The bit lines 226*a* are formed on the interlevel insulation patterns 212. Each bit line covers the impurity layer 220, and is connected to the upward face of the impurity layer 220. The plural bit lines 226*a* are each connected to the respective upward faces of the plural impurity layers 220 formed in the unit fin 206. And, each bit line 226*a* is also connected with the upward faces of the impurity layers 220 arranged along one column direction in the plane of FIG. 11.

The bit lines 226*a* are formed of a conductive film. For instance, the bit lines 226*a* can be formed with or include at least one of doped polysilicon, metal (e.g., tungsten or molybdenum), conductive metal nitride (e.g., titanium nitride or tantalum nitride), and metal silicide (e.g., tungsten silicide or cobalt silicide).

Insulating line patterns 214*a* are each disposed between the first and second bit lines 226*a* adjacent to each other. The insulating line patterns 214*a* cover the channel regions and intersect the fins 206 and the first and second gate lines 210*a* and 210*b*. The insulating line patterns 214*a* are arranged in parallel over the substrate 200, each corresponding with the plural channel regions formed in the fin 206. Spaces between the insulating line patterns 214*a* adjacent to each other form grooves 216. The grooves 216 are filled with the bit lines 226*a*. Here, it is preferred to level the top faces of the insulating line pattern 214*a* with the top faces of the bit lines 226*a*.

Between the insulating line patterns 214*a* and the upward faces of the channel regions are interposed capping patterns 204*a*. The top faces of the capping patterns 204*a* can be level with the top faces of the interlevel insulation patterns 212. The protruding portions of the gate lines 210*a* and 210*b*, higher than the top face of the fin 104, are partially adjacent to sidewalls of the capping patterns 204*a*.

The bit lines 226*a* fill openings 218 enclosed by the interlevel insulation patterns 212 and the sidewalls of the adjacent capping patterns 204*a*. The openings 218 reveal the impurity layers 220. Thereby, the bit lines 226*a* are connected with the upward faces of the impurity layers 220 through the openings 218. The openings 218 are disposed at both sides of the insulating line patterns 214*a*.

Sidewalls of the openings 218 can include portions of the gate lines 210*a* and 210*b*, which protrude higher than the top face of the fins 206. In this structure, insulators are interposed between the gate lines 210*a* and 210*b* and the bit lines 226*a*. The insulators are preferred to be surface insulation layers 222, which are formed on the protruding portions of the gate lines 210*a* and 210*b* that constitute the sidewalls of the openings 218, or insulation spacers 224 formed on the sidewalls of the openings 218. The surface insulation layers 222 are formed of an insulation material made by conducting oxidation and nitrification to the surfaces of the protruding portions of the gate lines 210*a* and 210*b*. The insulation spacers 224 can be made of silicon oxide or silicon nitride. The insulation spacers 224 can be also disposed on sidewalls of the grooves 216. In other words, the insulation spacers 224 can be also interposed between the insulating line patterns 214*a* and the bit lines 226*a*.

The insulating line patterns 214*a* are preferably made of an insulation material having etching selectivity relative to the interlevel insulation patterns 212. For instance, the interlevel insulation patterns 212 can be formed of silicon oxide, while the insulating line patterns 214*a* can be formed of silicon nitride. The capping patterns 204*a* preferably to contains an insulation material having the same etching selectivity with the insulating line patterns 214*a*. For example, the capping patterns 204*a* can include silicon nitride.

A unit cell is constituted by including a pair of the adjacent impurity layers 220, the channel region between the pair of the adjacent impurity layers 220, and the first and second gate lines 210*a* and 210*b*. One of the impurity layers pair is defined as a first impurity layer, while the other of the impurity pair is defined as a second impurity layer. The bit lines 226*a* connected with the first impurity layers 220 are referred to as first bit lines, while the bit lines 226*a* connected with the second impurity layers 220 are referred to as second bit lines. The grooves 216 and openings 218 filled by the first bit lines 226*a* are defined as first groves and bit lines, while the grooves 216 and openings 218 filled by the second bit lines 226*a* are defined as second groves and bit lines. The first and second impurity layers 220 are shared by other unit cells adjacent to the unit cell at both sides thereof. Thereby, the first and second bit lines 226*a* are also shared by other unit cells adjacent to the unit cell at both sides thereof.

The bottom sides of the impurity layers 220 contact with the buried insulation film 202. The channel regions are conductively isolated from each other through the first and second impurity layers 220 and the buried insulation film 202. Namely, the channel regions are floated. These floating channel regions are used as data storage fields.

There is a difference between a threshold voltage of the unit cell where excessive charges are stored in the floating channel region, and a threshold voltage of the unit cell where excessive charges are absent in the floating channel region. As an example, a unit cell of NMOS transistor type (hereinafter, 'NMOS unit cell') will be described, wherein the impurity layers 220 are doped with N-type impurities. A threshold voltage of the NMOS unit cell where excessive holes are stored in the floating channel region is lower than a threshold voltage of the NMOS unit cell where excessive holes are absent in the floating channel region. Thus, a data bit stored in the unit cell is determined as being logically '0' or '1' by supplying one of the first and second gate lines 210*a* and 210*b* with a sensing voltage that is intermediate between the threshold voltages different according to presence of charges. During a read operation, the sensing voltage is applied to one of the first and second gate lines 210*a* and 210*b*, while the other of the first and second gate lines 210*a* and 210*b* is supplied with a voltage capable of providing electrical attraction for excessive charges stored in the floating channel region. For instance, the sensing voltage is applied to the first gate line 210*a*, while the voltage for attraction is applied to the second gate line 210*b*. When the excessive charges are holes, the voltage for attraction is preferred to be negative. The voltage for attraction is able to be normally supplied thereto during an operation of the semiconductor device.

Storing excessive holes into the unit cell having the floating channel region can be accomplished by using hot carrier effect. In detail, a gate voltage is applied to an alternative one of the first and second gate lines 210*a* and 210*b* so as to turn the floating channel region on, and a voltage higher than the gate voltage is applied to the first impurity layer 220. And, the ground voltage is applied to the second impurity layer 220. This bias condition causes electron-hole pairs to be generated by the hot carriers at the channel region around the first impurity layer 220. Electrons generated therein flow out through the first impurity layer 220, but holes thereof are stored in the floating channel region. During this, the floating channel region has excessive holes capable of maintaining a voltage lower than a threshold voltage (about 0.7V) of a PN junction between the channel region and the first impurity layer 220. When the gate voltage is applied to one of the first and second gate lines 210*a* and 210*b*, the other of the first and second gate lines 210*a* and 210*b* is supplied with the voltage providing attraction for the excessive holes. For instance, the voltage of attraction can be a negative voltage. Thereby, it enhances the capability of data retention in the unit cell. Further, the negative voltage applied to the first or second gate line is able to extend a depletion field in the channel region, assuring a sufficient space for accommodating the excessive holes. It is preferred to apply a predetermined voltage (e.g., the sensing or gate voltage) to one of the first and second gate lines 210*a* and 210*b* for operating the unit cell, while to normally apply the voltage, which attracts the excessive charges stored in the floating channel region, to the other of the first and second gate lines for retaining data.

There is an alternative approach of settling excessive holes in the floating channel region, utilizing gate-induced drain leakage (GIDL) effect. In this mode, a positive voltage is applied to the first impurity layer 220 while the ground voltage or a negative voltage is applied to the first gate line 210*a*. Thereby, a depletion layer in a region where the first gate line 210*a* overlaps with the first impurity layer 220 gets abruptly bent to make electrons tunnel into the conduction band from the valence band. During this, the tunneling electrons induce electron-hole pairs and holes generated therein are stored in the floating channel region as the excessive holes.

Removing the excessive holes from the floating channel region is accomplished by setting a forward-biased voltage to the PN junction between the channel region and one of the first and second impurity layers 220. For instance, when a negative voltage is applied to the first impurity layer 220, the forward-biased voltage is set to the PN junction between the floating channel region and the first impurity layer 220. Thereby, the excessive holes flow out from the floating channel region to the first impurity layer 220. Here, the negative voltage applied to the first impurity layer 220 is preferred to be higher than a threshold voltage (about 0.7V) of the PN junction diode.

The semiconductor device including such unit cells is able to remove the excessive holes from the plural unit cells at the same time. In other words, the excessive holes can be removed from plural cells in the unit of cell block at a time. Otherwise, the excessive holes can be removed from plural cells in the unit of small group in the cell block at a time.

According to the semiconductor memory device with aforementioned structure, the floating channel region is used as the data storage field. By offering the structure of self-alignment with bit lines 226*a*, the openings 218, and the impurity layers 220, alignment margins between them becomes zero. Thus, it minimizes an area for the unit cell, implementing highly integrated semiconductor device.

Figure 14:
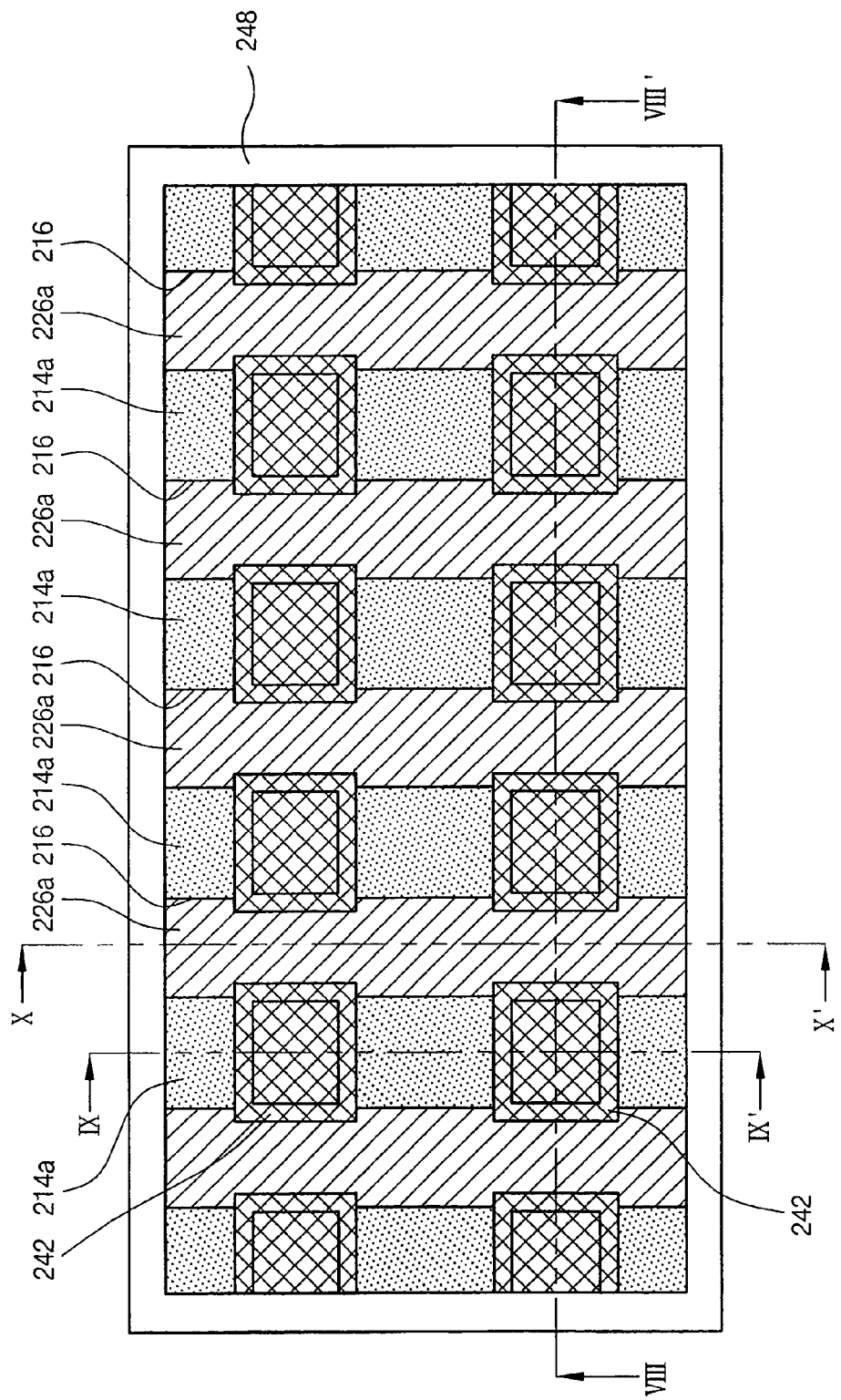
FIG. 14 is a plan view illustrating an embodiment of a modification of the semiconductor device of the second embodiment in accordance with aspects of the invention.

An embodiment with a modification of the semiconductor memory device illustrated in FIG. 11 is shown in FIG. 14. As will be evident in FIG. 14, beyond the modified feature, the semiconductor device of FIG. 14 is similar to the former memory device of FIG. 11. Therefore, the discussion of FIG. 14 will focus on the specifically modified portions therein.

Figure 15:
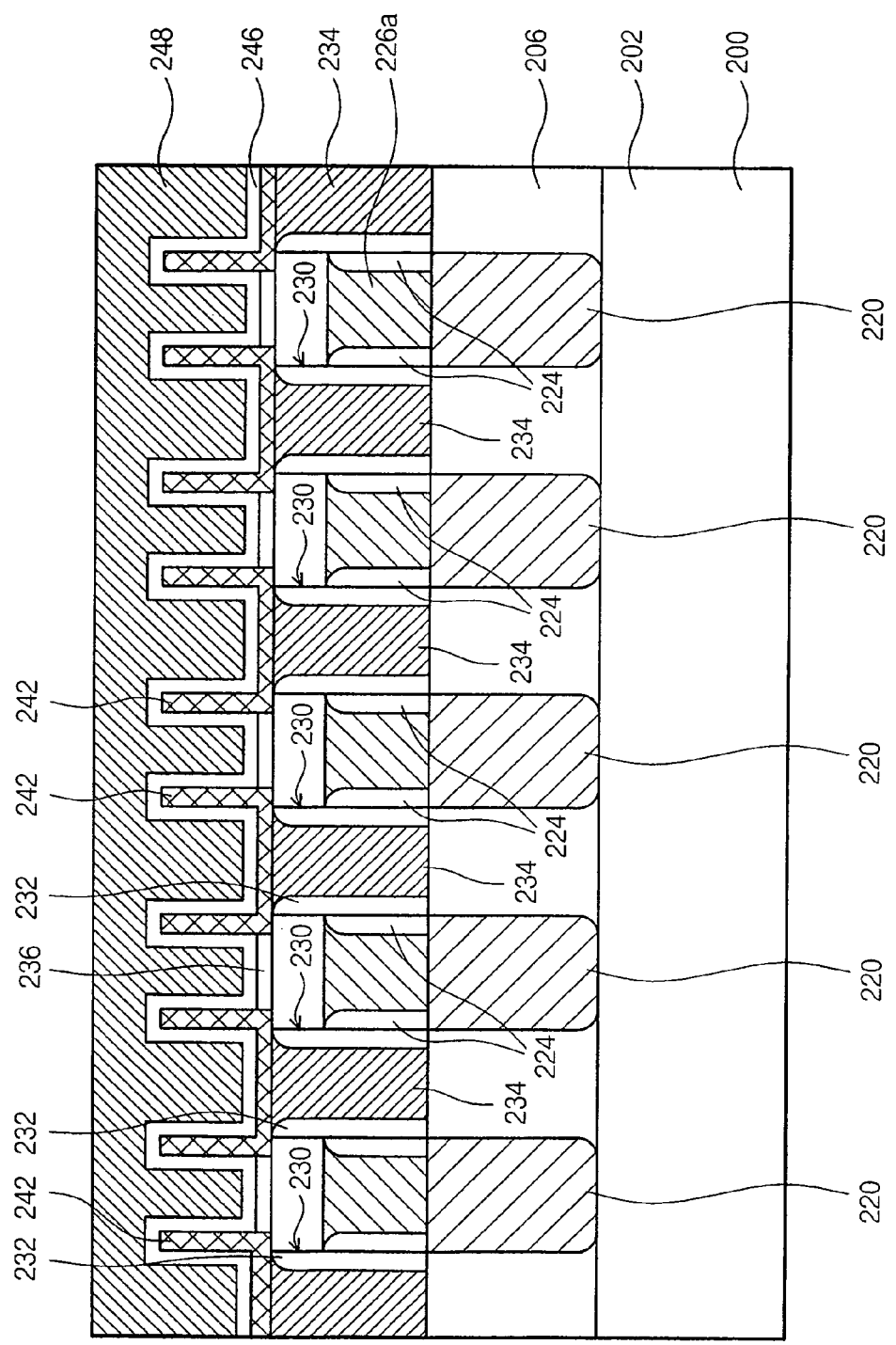
FIG. 15 is a sectional view taken along with VIII-VIII' of FIG. 14.
Figure 16:
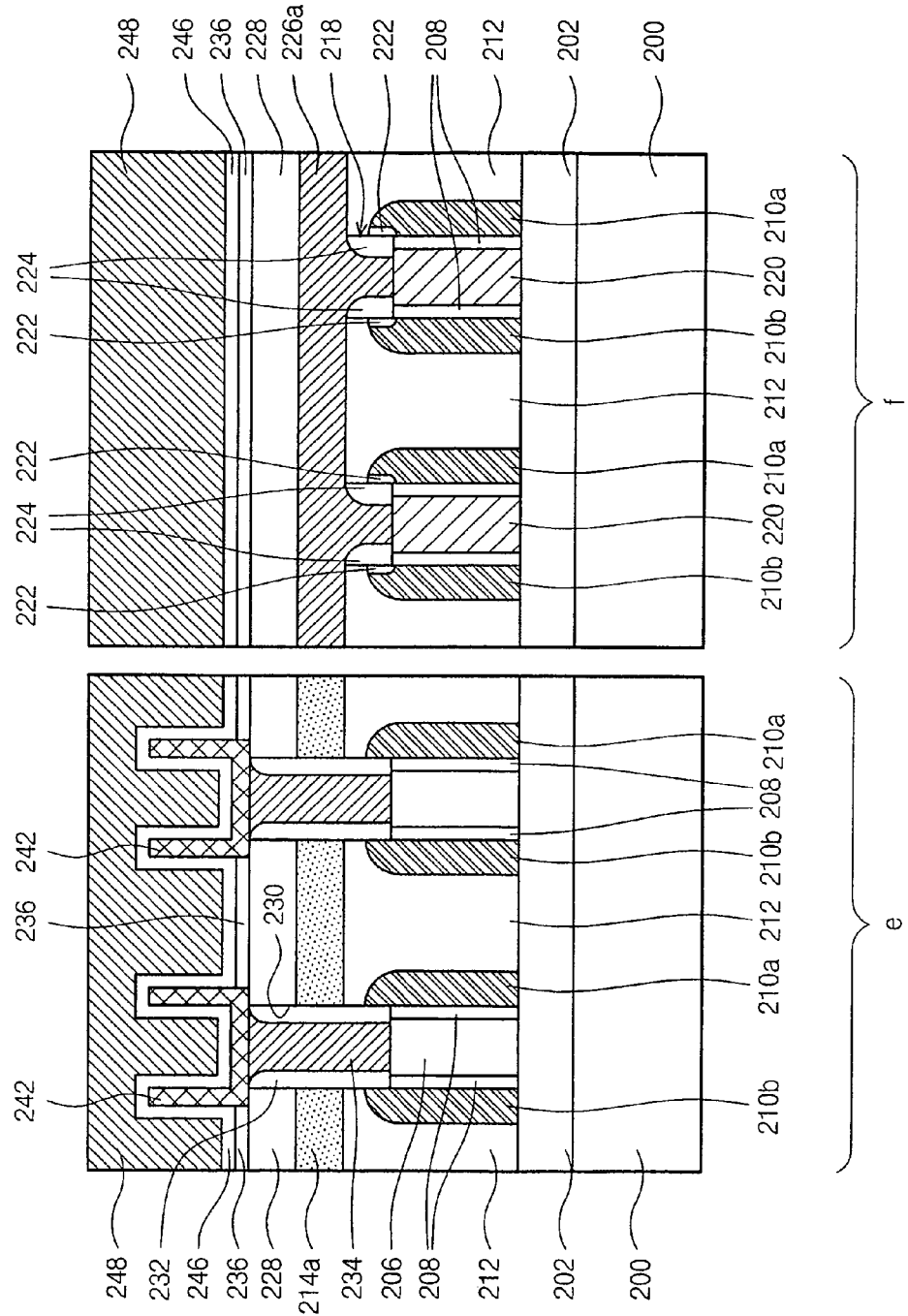
FIG. 16 illustrates sections taken along with IX-IX' and X-X' of FIG. 14.

FIG. 14 is a plan view illustrating the modification of the semiconductor memory device in accordance with the second embodiment. FIG. 15 is a sectional view taken along lines VIII-VIII' of FIG. 14, and FIG. 16 illustrates sections taken along lines IX-IX' and X-X' of FIG. 14. In FIG. 16, reference letters 'e' and 'f' denote the sections respective to lines IX-IX' and X-X' of FIG. 14.

Referring to FIGS. 14, 15, and 16, an upper interlevel insulation film 228 covers the bit lines 226*a* and the insulating line patterns 214*a*. Buried insulation spacers 232 are formed on sidewalls of buried contact holes 230 that penetrate the upper interlevel insulation films 228 and the insulating line patterns 214*a* and reveal the upward faces of the channel regions. Buried contact plugs 234 fill the buried contact holes 230 between the buried insulation spacers 232. On the substrate 200, the buried contact plugs 234 are disposed, each corresponding with the channel regions.

On the upper interlevel insulation film 228, bottom electrodes 242 are disposed on the top faces of the buried contact plugs 234. The bottom electrodes 242 can be formed in cylindrical shape as shown in FIG. 15 or 16. Otherwise, the bottom electrodes 242 can be formed in a plane or stacked type. Portions of the upper interlevel insulation film 228 between the bottom electrodes 242 can be covered by an etch-stopping film 236. The etch-stopping film 236 is preferably made of an insulation material having etching selectivity relative to the upper interlevel insulation film 228. For instance, the upper interlevel insulation film 228 can be formed of silicon oxide, while the etch-stopping film 236 can be formed of silicon nitride.

A dielectric film 246 is coated on the surfaces of the bottom electrodes 242 and a top electrode 248 is formed on the dielectric film 246. The bottom electrode 242, the dielectric film 246, and the top electrode 248 constitute a capacitor. The bottom and top electrodes 246 and 248 are formed of conductive films. The dielectric film 246 can include an oxide-nitride-oxide (ONO) film or a high-k film (i.e., k=dielectric constant) such as insulating metal oxide, e.g., hafnium oxide or aluminum oxide.

According to the modification shown in FIGS. 14 through 16, the capacitor is connected to the upward surface of the channel region. That is, the data storage field is comprised of the floating channel region and the bottom electrode of the capacitor, thereby increasing the quantity of excessive charges accumulated in the data storage field. As a result, this structure further enhances the capability of data retention for the unit cell.

FIGS. 17A through 20A are sectional views illustrating processing steps for fabricating the semiconductor device according to the second embodiment of the invention, taken along with V-V' of FIG. 11, and FIGS. 17B through 20B are sectional views illustrating processing steps for fabricating the semiconductor device according to the second embodiment of the invention, taken along with VI-VI' and VII-VII' of FIG. 11.

Figure 17A:
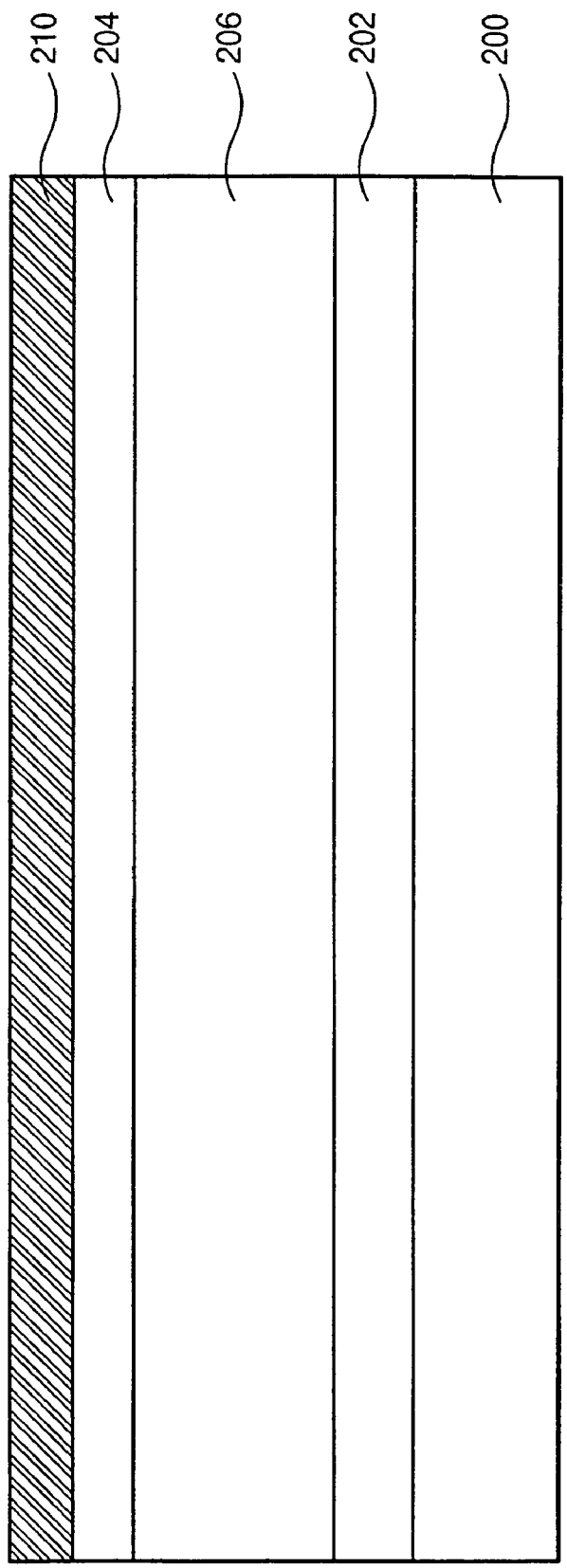
Figure 17B:
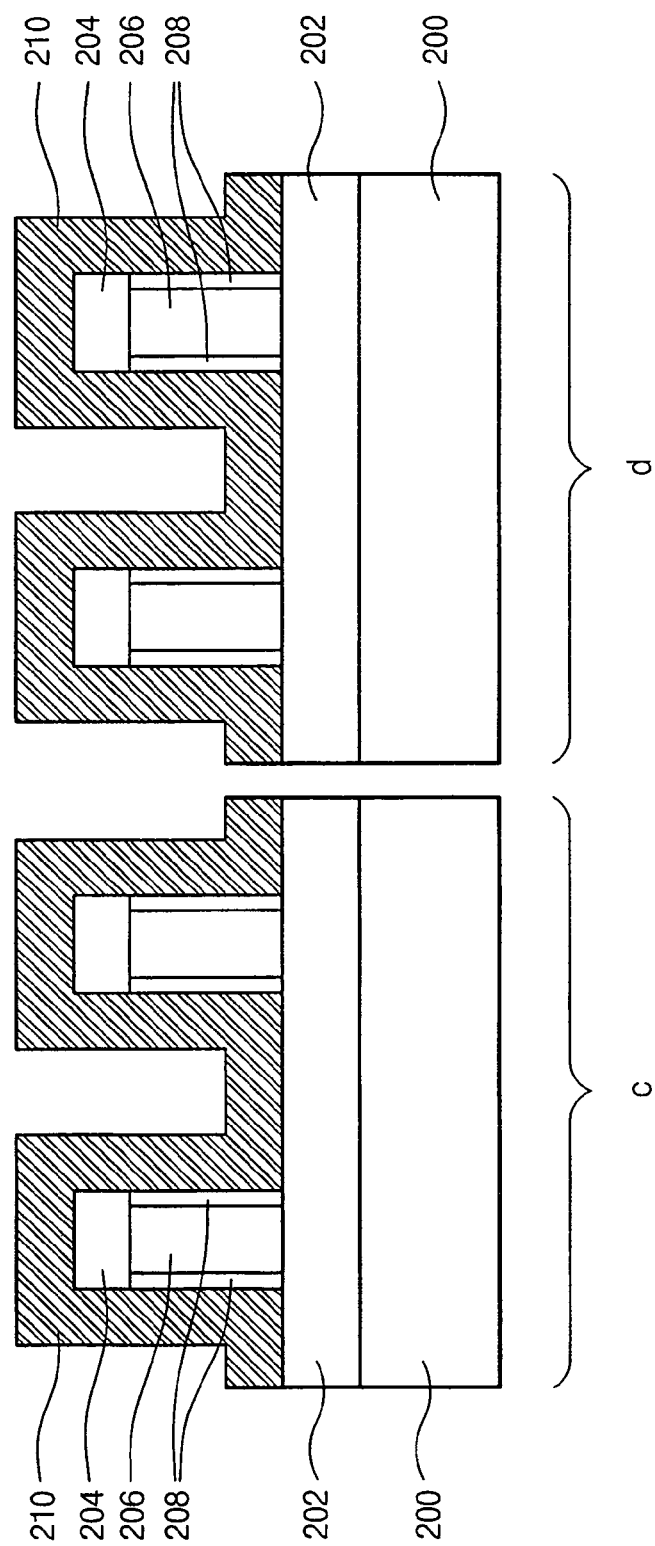

First, referring to FIGS. 17A and 17B, the buried insulation film 202 and a semiconductor layer are sequentially formed on the substrate 200. The buried insulation film 202 and semiconductor layer can be formed in various ways for preparing a silicon-on-insulator (SOI) substrate.

Then, after forming hard mask patterns 204 that are arranged in parallel along a direction on the semiconductor layer, the semiconductor layer is etched away under the hard mask patterns 204 as an etching mask until the buried insulation film 202 is revealed, resulting in the fins 206 arranged in parallel on the buried insulation film 202. The fins 206 are constructed to include the first and second sidewalls.

The gate insulation films 208 are formed on the first and second sidewalls of the fins 206. The gate insulation films 208 are preferably formed through thermal oxidation. Thereafter, the conductive gate film is conformably deposited over the substrate 200.

Figure 18A:
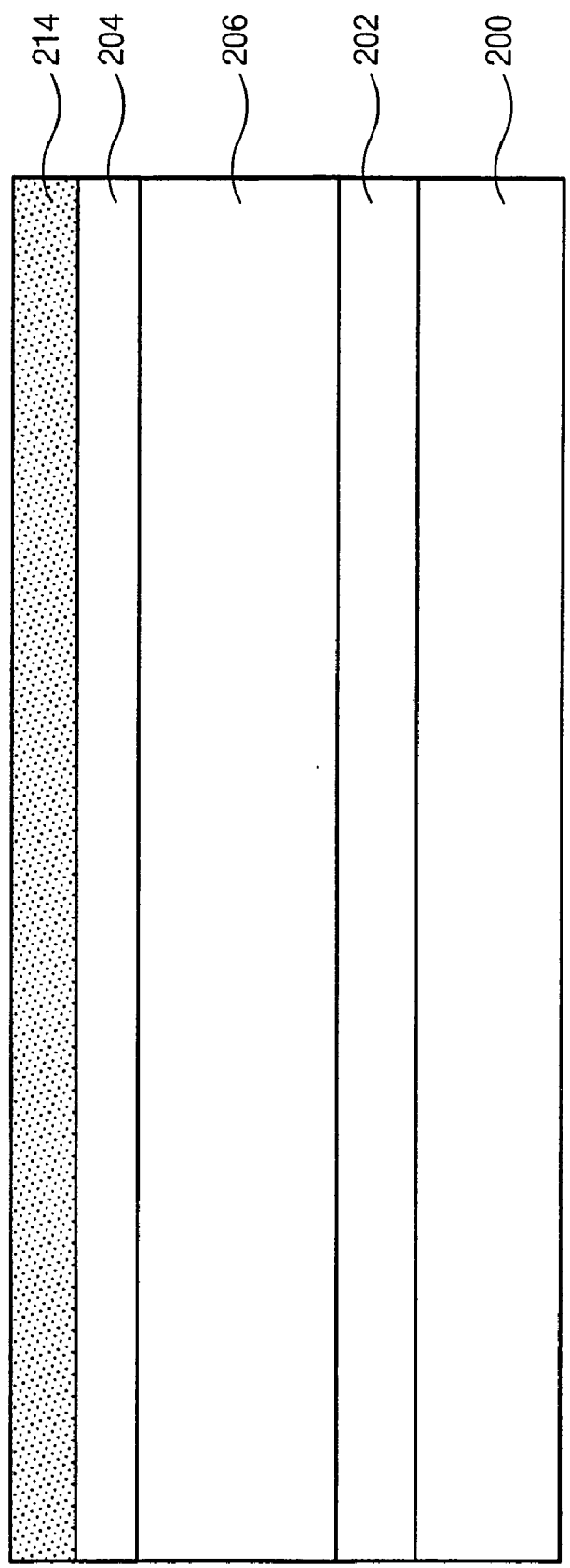
Figure 18B:
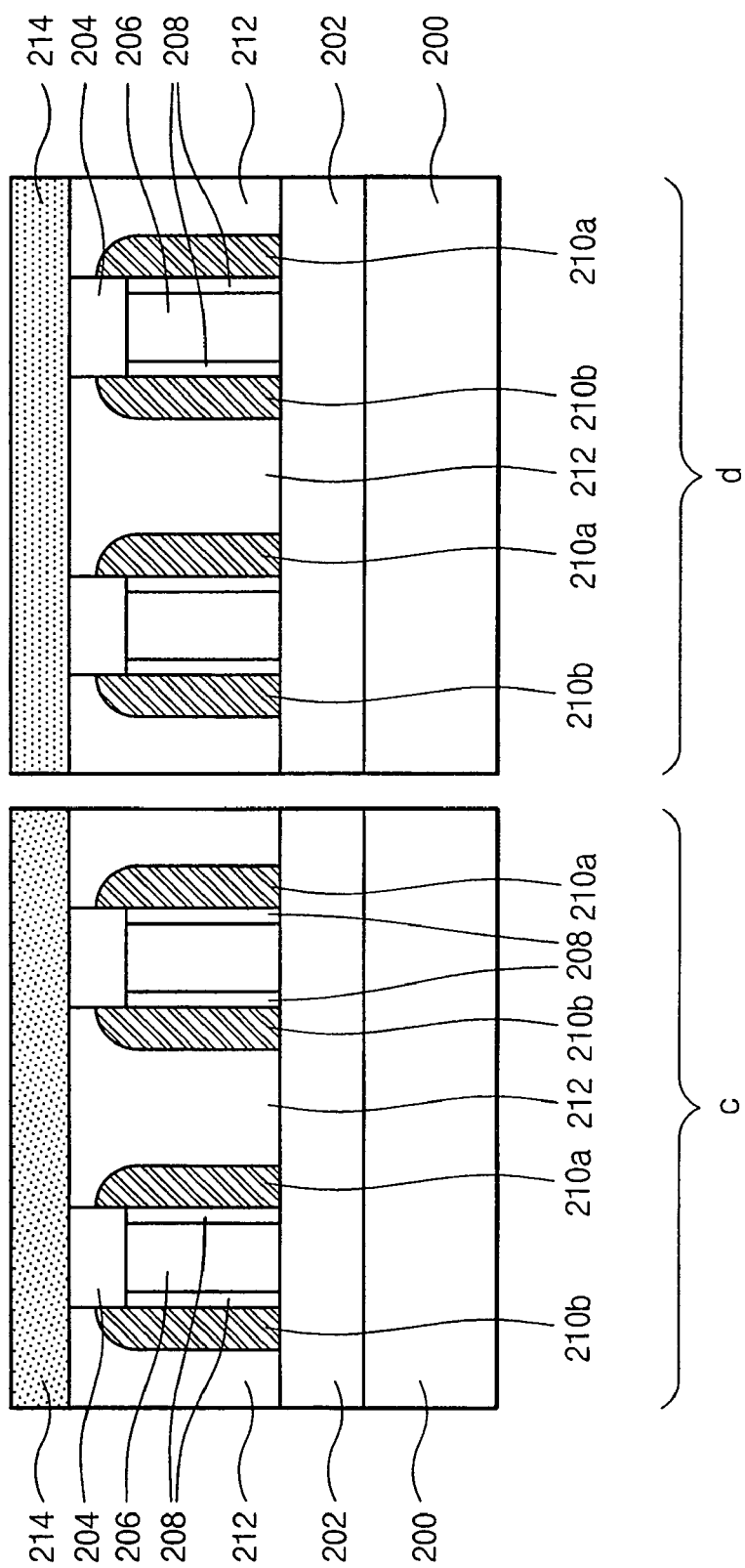

Next, referring to FIGS. 18A and 18B, the conductive gate film is anisotropically etched to form the first gate lines 210a on the first sidewalls of the fins 206 in the shape of spacers and to form the second gate lines 210b on the second sidewalls of the fins 206 in the shape of spacers. In this case, a patterning process can be further carried out, after the anisotropic etching step, for cutting off the connection parts between the first and second gate lines 210a and 210b at edges of the cell array region.

Here, it is preferred to anisotropically over-etch the conductive gate film to make the top faces of the first and second gate lines 210a and 210b lower than the top faces of the hard mask patterns 204.

After depositing an interlevel insulation film over the substrate 200, the interlevel insulation film is reduced until the hard mask patterns 204 are revealed. This planarization process results in the interlevel insulation patterns 212. The interlevel insulation patterns 212 cover the substrate 200 and the gate lines 210a and 210b, around the fins 206. The top faces of the interlevel insulation patterns 212 are preferably level with the top faces of the hard mask patterns 204.

Thereafter, a mold insulation layer 214 is deposited over the substrate 200. The mold insulation layer 214 is preferred to be made of an insulation material having etching selectivity to the interlevel insulation pattern 212. The mold insulation layer 214 can be formed of an insulation material having the same etching selectivity with the hard mask pattern 204. For instance, the interlevel insulation pattern 212 can be formed of silicon oxide while the mold insulation layer 214 can be formed of silicon nitride. Here, the hard mask pattern 204 is preferably includes silicon nitride.

Figure 19B:
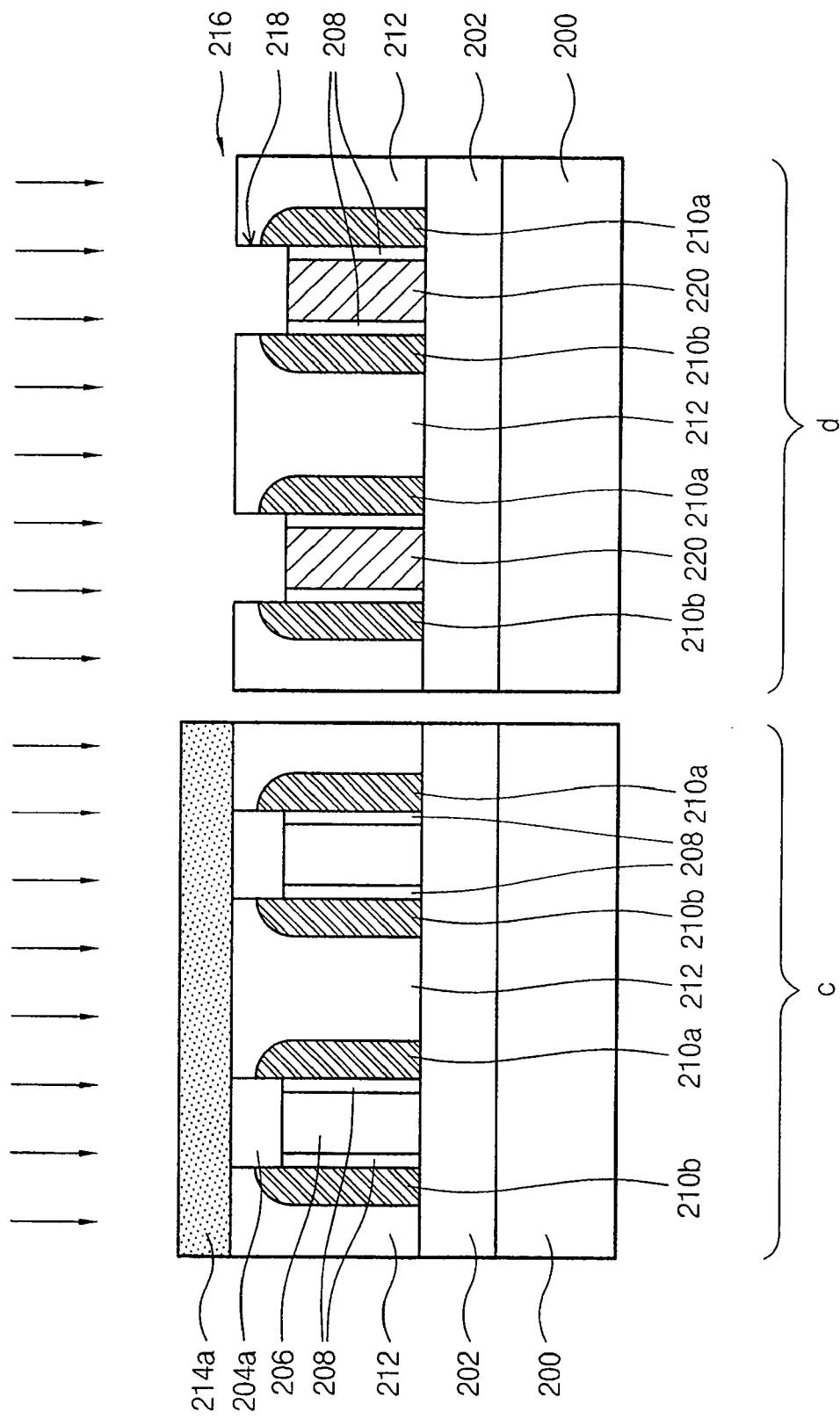

Next, referring to FIGS. 19A and 19B, the mold insulation layer 214 is patterned to form the grooves 216 intersecting the fins 206 in parallel with a predetermined interval and partially revealing the interlevel insulation patterns 212 and the hard mask patterns 204. The patterned mold insulation layers placed between the adjacent grooves 216 are defined as the insulating line patterns 214a. The fins 206 under the insulating line patterns 214a are defined as the channel regions.

The hard mask patterns 204 revealed by the grooves 216 are removed, by means of anisotropic etching, to form the openings 218 that reveal the top faces of the fins 206. It is preferred to conduct an in-situ etching process to form the grooves 216 and the openings 218. According to this operation, the openings 218 and the grooves 216 are completed in self-alignment without any substantial misalignment therebetween. As a result, it is possible to implement a highly integrated DRAM device.

While forming the openings 218, the capping patterns 204a are formed between the insulating line patterns 214a and the top faces of the fins 206. The capping patterns 204a are parts of the hard mask patterns 204. The openings 218 are enclosed by the interlevel insulation patterns 212 and the sidewalls of the capping patterns 204a. The openings 218 can partially reveal the protruding portions of the gate lines 210a and 210b, which are higher than the top face of the fin 206. Then, using the insulating line patterns 214a as a mask, ionic impurities are implanted into the fins 206, which are revealed by the openings 218, to form the impurity layers 220.

Figure 20A:
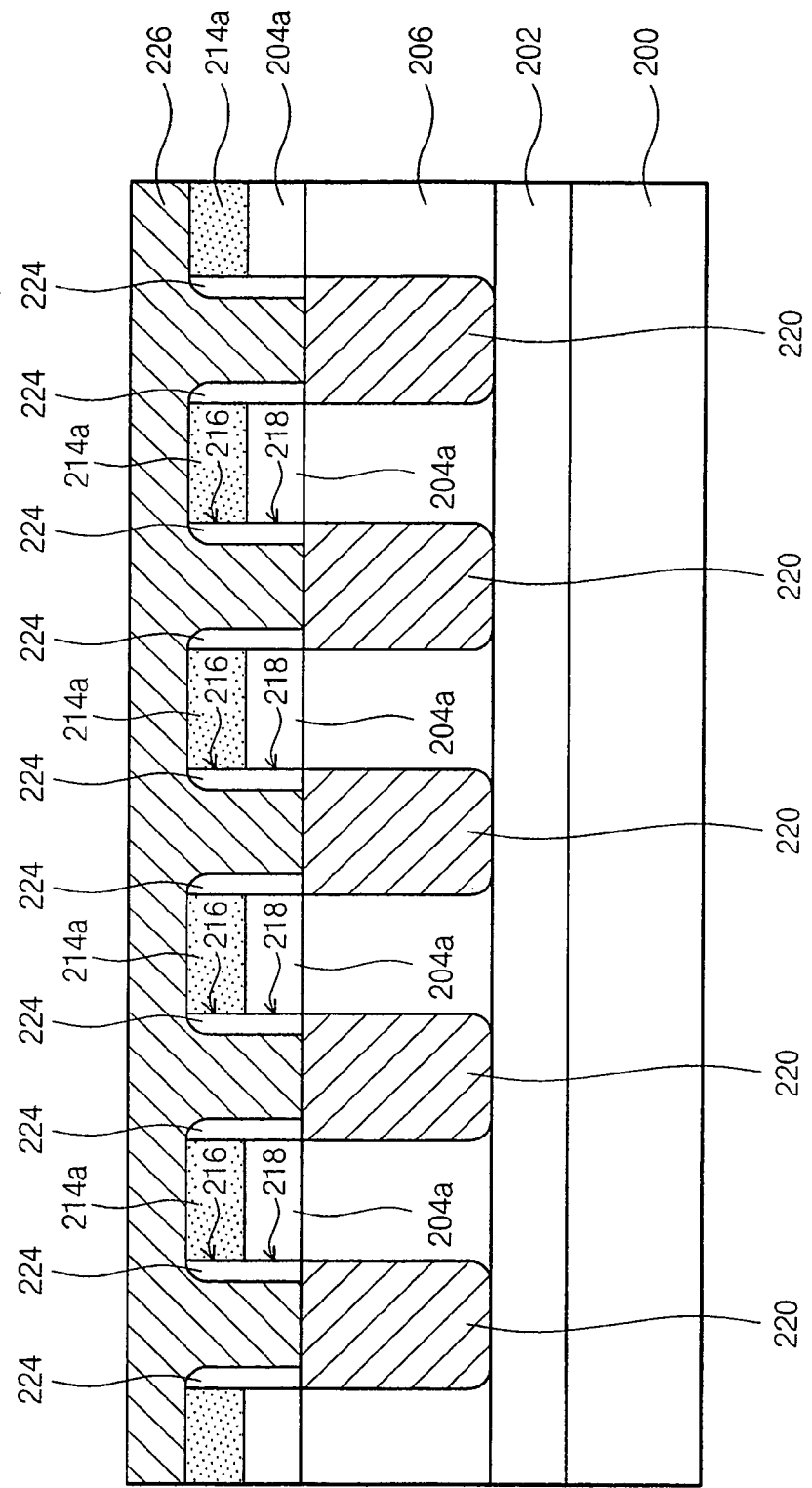
Figure 20B:
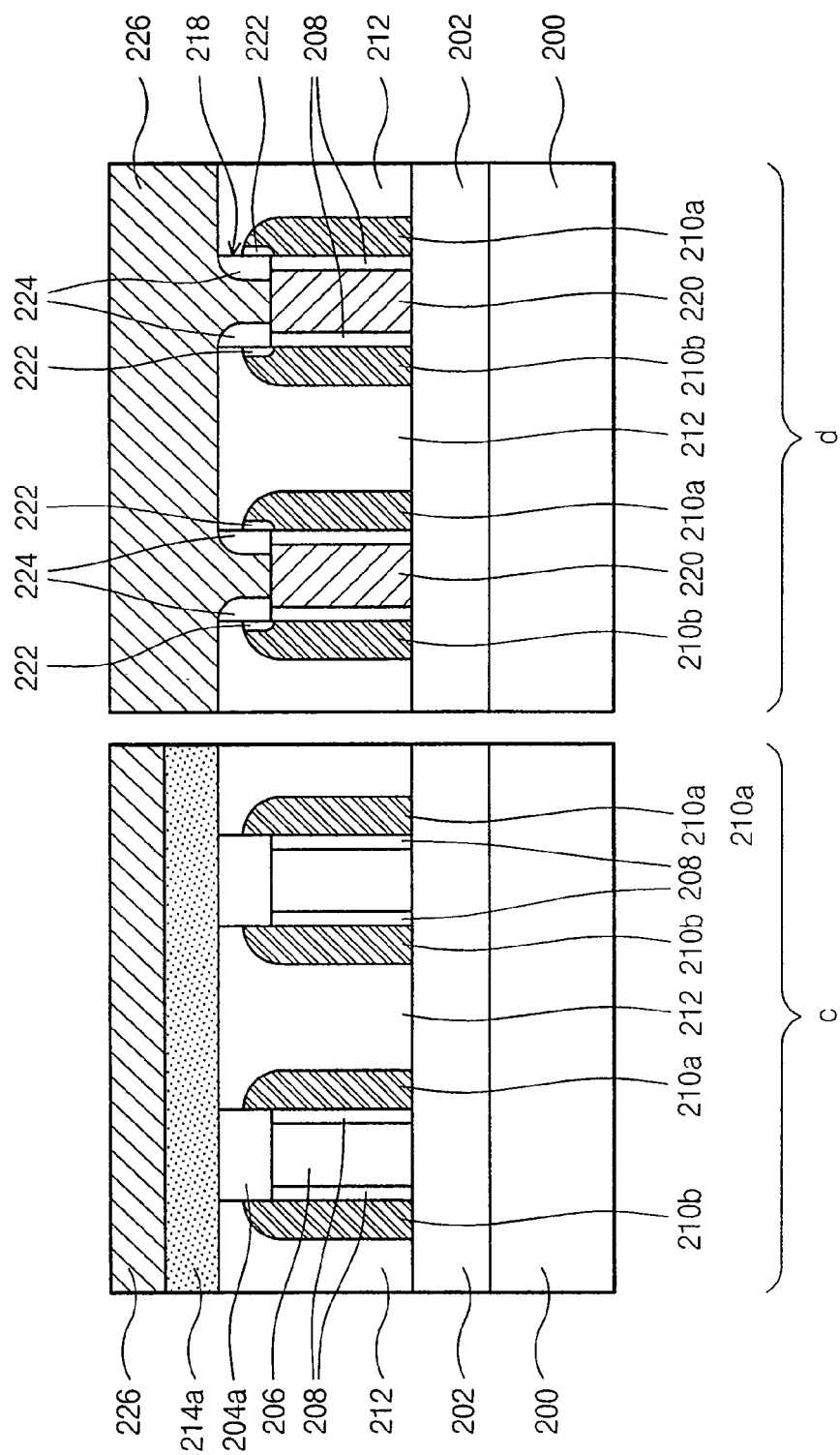

Next, referring to FIGS. 20A and 20B, the surface insulation layers 222 can be formed by carrying out nitrification and oxidation on the surfaces of the gate lines 210a and 210b revealed by the openings 218. The insulation spacers 224 can be formed on the sidewalls of the openings 218. It is preferred to conduct at least one of processing steps of forming the surface insulation layers 222 and the insulation spacers 224. The insulation spacers 224 can be formed on the sidewalls of the grooves 216.

As with the first embodiment, it is permissible to conduct the ion implantation for the impurity layers 220 after forming the surface insulation layers 222 or/and the insulation spacers 225.

Thereafter, a conductive bit line film 226 is deposited over the substrate 200, filling the openings 218 and the grooves 216. The conductive bit line film 226 contacts with the impurity layers 220 revealed by the openings 218. The conductive bit line film 226 is reduced until the insulating line patterns 214a are revealed, forming the bit lines 226a shown in FIGS. 11, 12, and 13. As a result, the DRAM device shown in FIGS. 11, 12, and 13 can be made.

According to the aforementioned method of fabricating the DRAM device, the grooves 216 and the impurity layers 220 are completed in self-alignment, as well as the grooves 216 and the openings 218. Therefore, the second embodiment provides the same facility as the first embodiment. In addition, using the floating channel region as the data storage field minimizes the troubles of step differences formed therein, making it easier to fabricate the semiconductor device.

Now, hereinafter will be described a method of fabricating the modified semiconductor device shown in FIGS. 14, 15, and 16. These steps can include all the manners proposed by way of FIGS. 17A through 20A and 17B through 20B.

FIGS. 21A through 23A are sectional views illustrating processing steps for fabricating the semiconductor device shown in FIG. 14, taken along lines VIII-VIII' of FIG. 14, and FIGS. 21B through 23B are sectional views illustrating processing steps for fabricating the semiconductor device shown in FIG. 14, taken along lines IX-IX' and X-X' of FIG. 14.

Figure 21A:
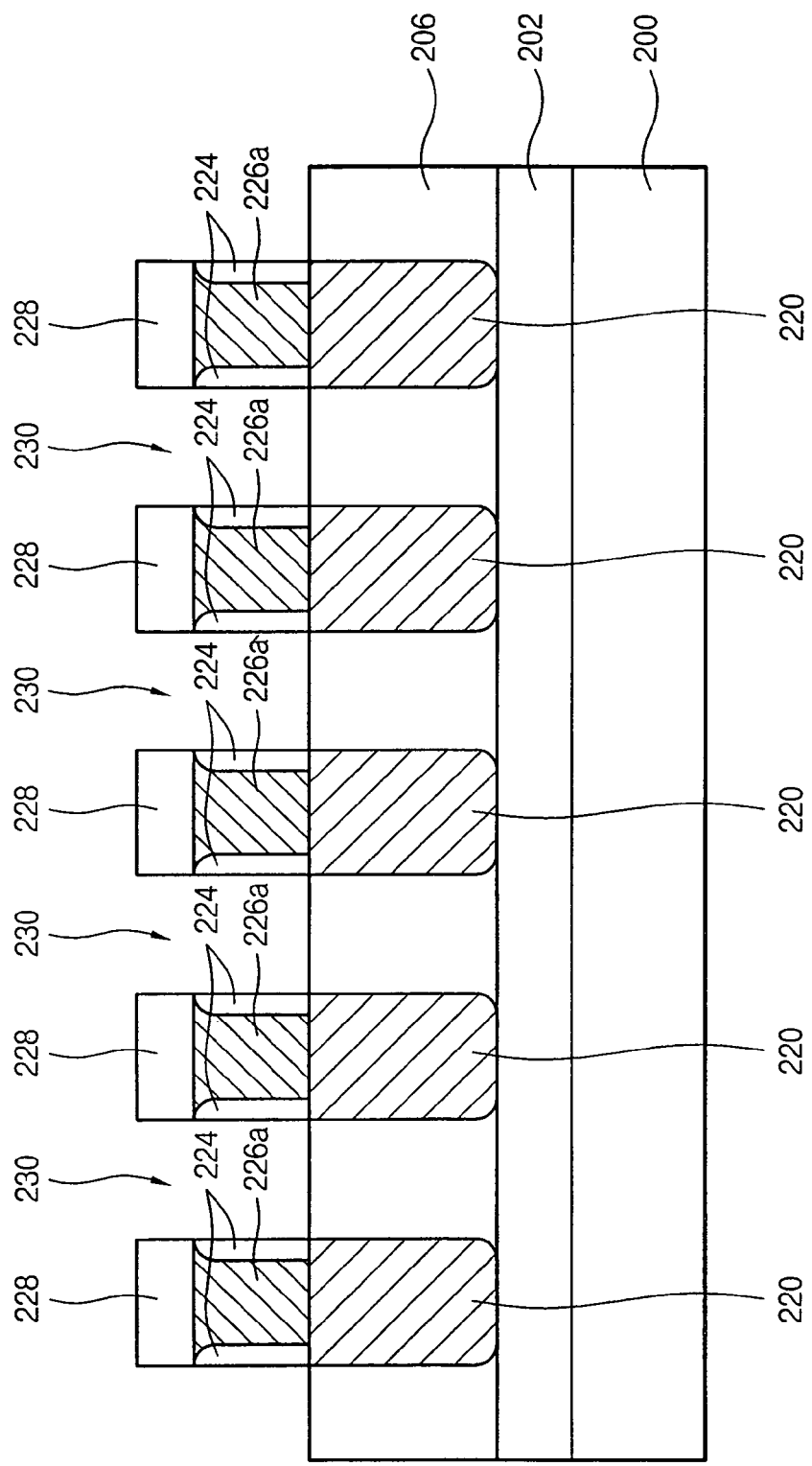
Figure 21B:
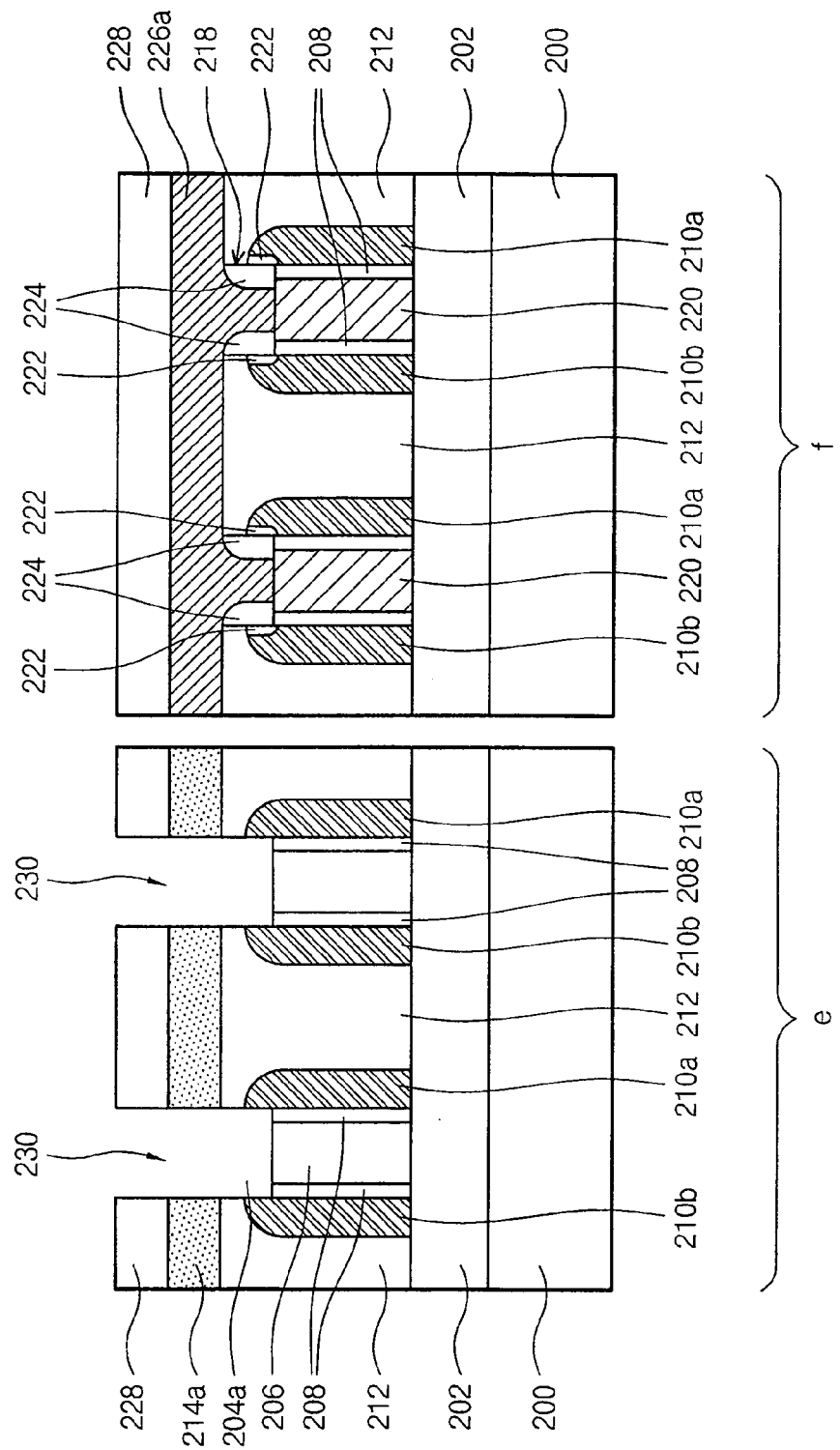

Referring to FIGS. 21A and 21B, the upper interlevel insulation film 228 is deposited on the substrate 200 including the insulating line patterns 214*a* and the bit lines 226*a*. The upper interlevel insulation film 228 and the insulating line patterns 214*a* are successively patterned to form the buried contact holes 230 revealing the channel regions. The buried contact holes 230 are arranged corresponding to the channel regions on the substrate.

Figure 22A:
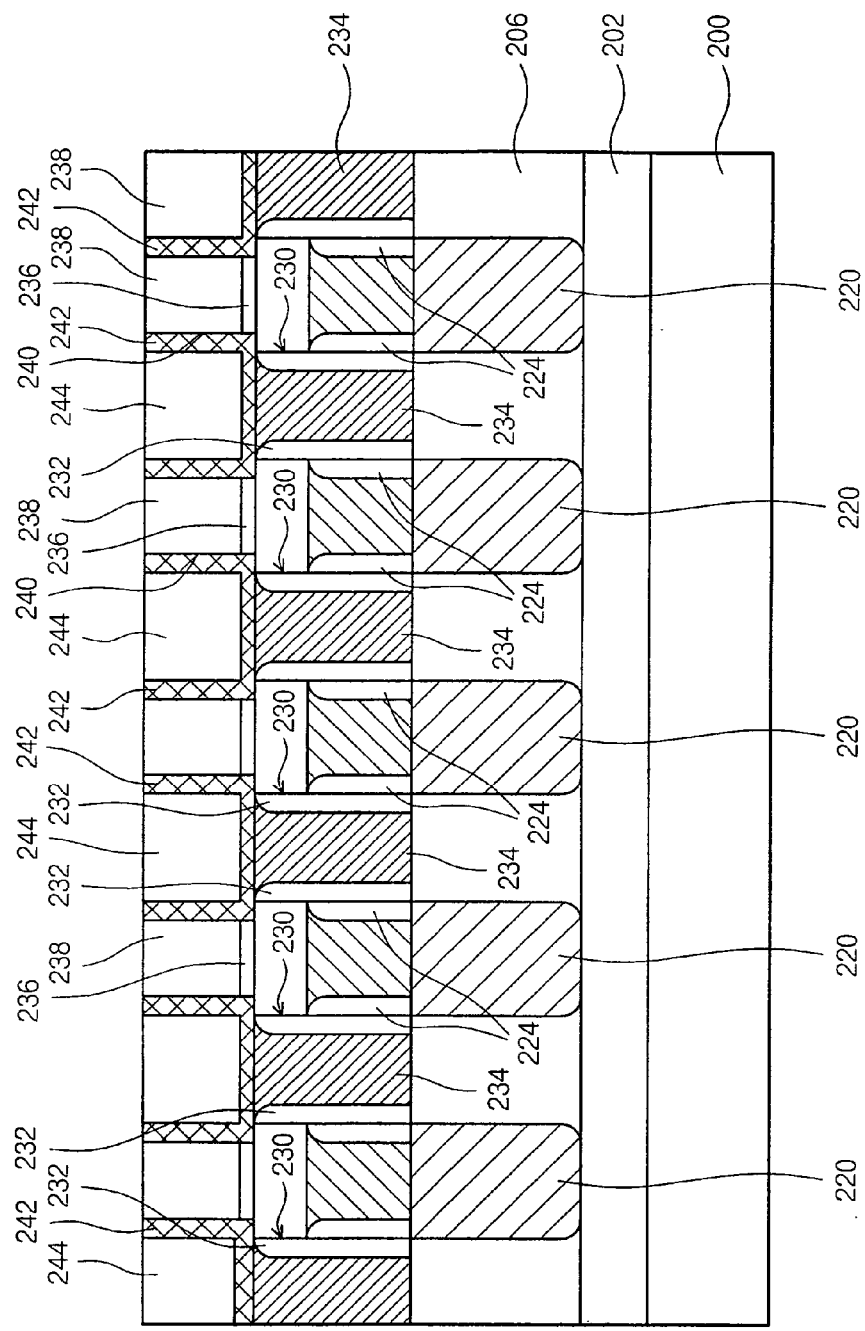
Figure 22B:
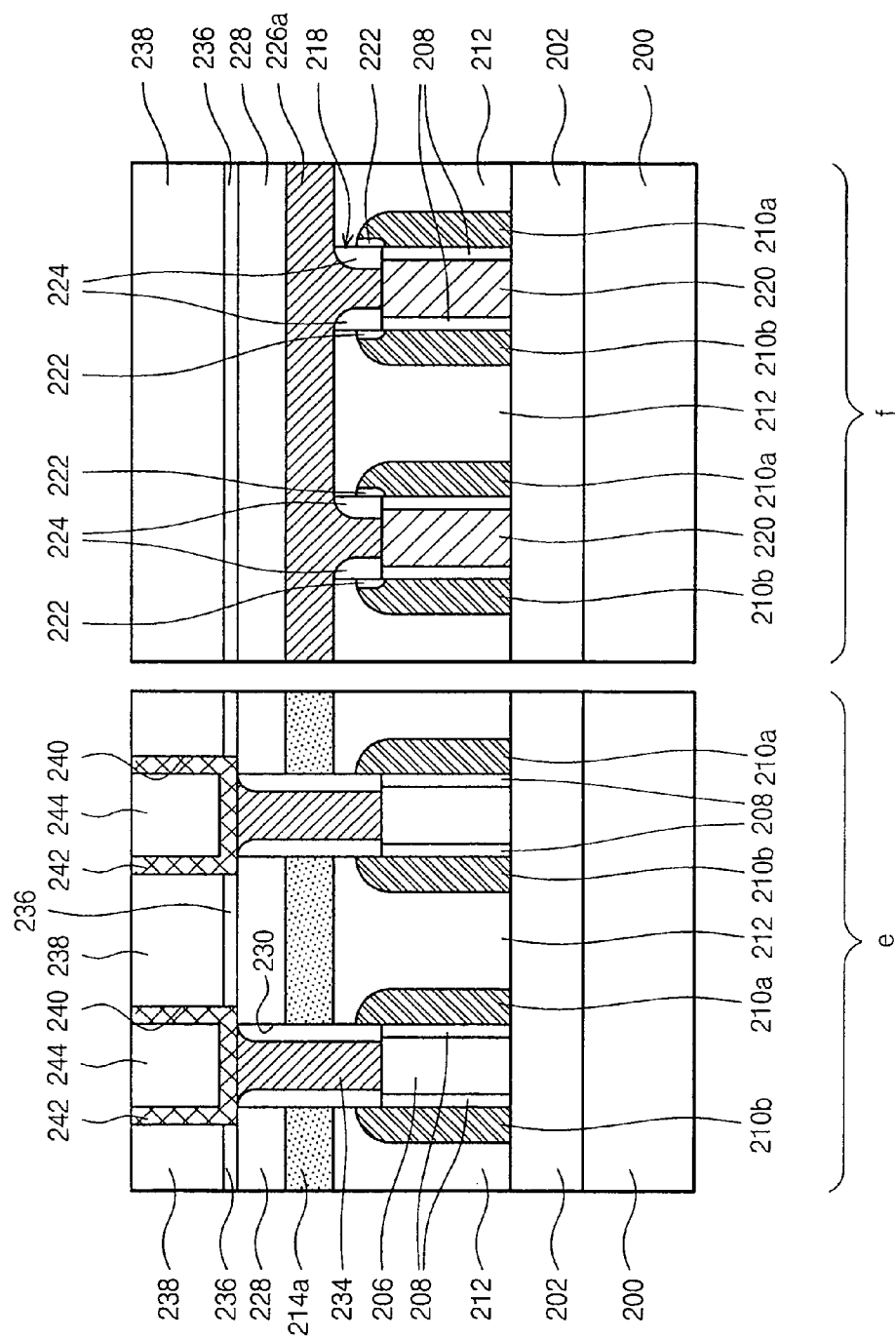

Next, referring to FIGS. 22A and 22B, the buried insulation spacers 232 are formed on the sidewalls of the buried contact holes 230. The buried insulation spacers 232 can be made of silicon nitride or silicon oxide. The buried contact plugs 234 are formed between the buried insulation spacers 232, filling the buried contact holes 230. The buried contact plugs 234 are made of a conductive material.

Next, the etch-stopping film 236 and the upper mold layer 238 are sequentially deposited and patterned to electrode holes 240 revealing the buried contact plugs 234. The etch-stopping film 236 is made of an insulation material having etching selectivity to the upper mode layer 238 and the upper interlevel insulation film 228.

Thereafter, a bottom electrode film is conformably formed over the substrate 200, including the electrode holes 240, and a passivation film is deposited on the bottom electrode film. The passivation and bottom electrode films are reduced until the upper mold layer 238 are revealed, forming the cylindrical bottom electrodes 242 and passivation patterns 244 in the electrode holes 240.

Figure 23B:
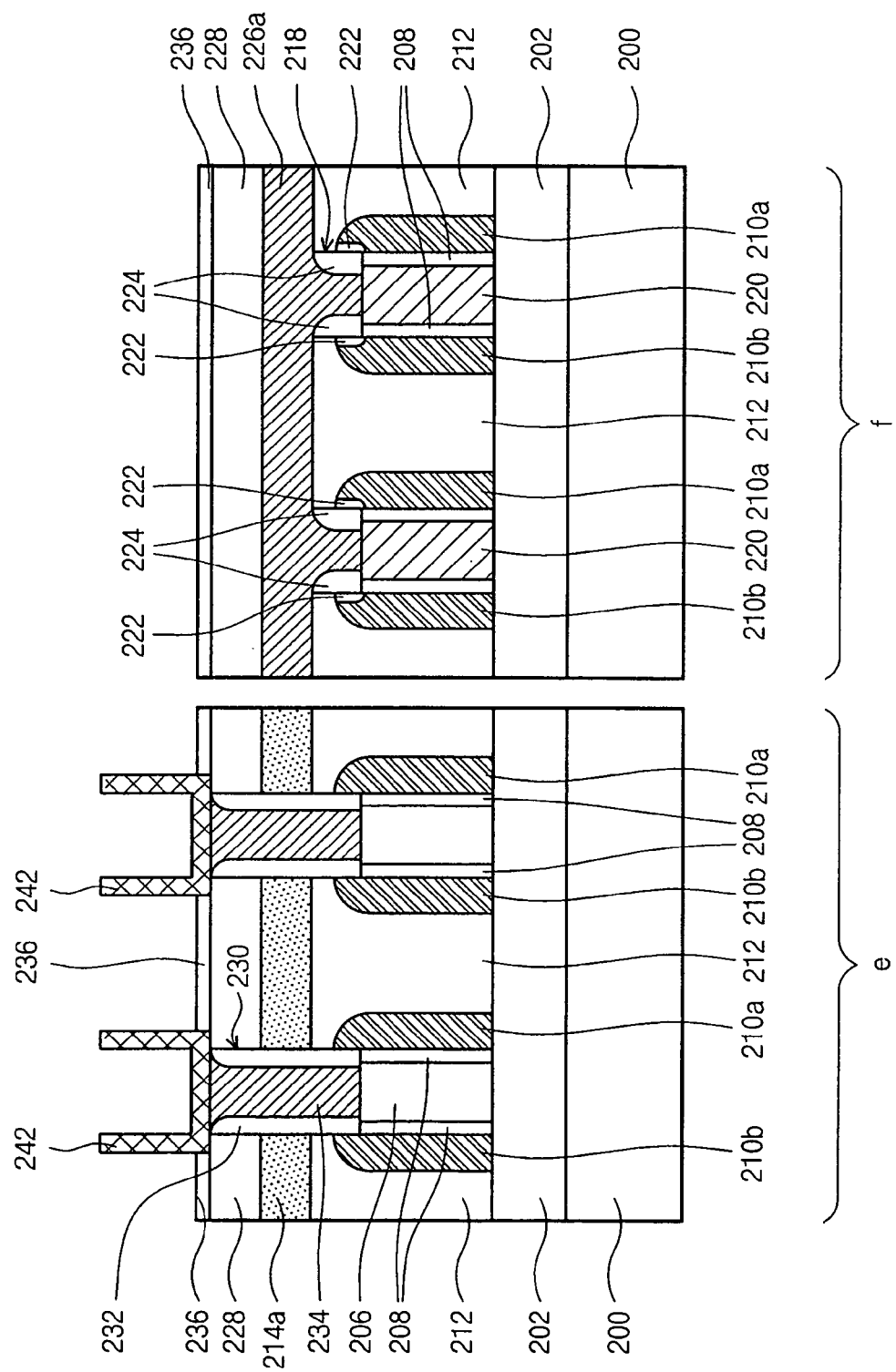

Next, referring to FIGS. 23A and 23B, the upper mold layers 238 and the passivation patterns 244 are removed to reveal inner and outer sidewalls of the bottom electrodes 242. Subsequently, the dielectric film 246 and the top electrode 248 shown in FIGS. 14, 15, and 16 are formed in sequence, resulting in the DRAM device illustrated in FIGS. 14, 15, and 16.

As aforementioned, according to aspects of the present invention, the first and second gate lines are formed on both sidewalls of the pins. And, a pair of impurity layers is provided to the fin, being isolated from each other to confine the channel region in the fin between the first and second gate lines. Thus, the controllability to the channel region by the first and second gate lines is improved, minimizing a short channel effect therein and, hence, implementing a highly integrated semiconductor device.

Further, since a couple of bit lines each connected to a pair of impurity layers are shared by adjacent unit cells, it is possible to provide a highly integrated semiconductor device.

Additionally, providing a self-aligned structure for the impurity layers and the grooves in which the bit lines are settled, the alignment margin becomes zero is advantageous in fabricating a highly integrated semiconductor device.

Moreover, as the first and second gate lines are formed in the pattern of spacers, it is permissible to form the first and second gate lines smaller than the minimum width that is defined by a typical photolithography process. From the morphological advancement with the gate and bit lines, it is possible to fabricate the unit cell in the area of $4F^2$, providing a highly integrated semiconductor memory device.

The above-disclosed subject matter is to be considered illustrative, and not restrictive, and the appended claims are intended to cover all such modifications, enhancements, and other embodiments, which fall within the true spirit and scope of the present invention.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A semiconductor device comprising:
   a fin disposed on a substrate, the fin having first and second sidewalls opposite to each other;
   a first gate line formed on the first sidewall of the fin in the shape of a spacer;
   a second gate line formed on the second sidewall of the fin in the shape of a spacer;
   first and second impurity layers isolated from each other in the fin, forming a channel region in the fin between the first and second gate lines;
   an interlevel insulation pattern covering the substrate and the first and the second gate lines around the fin; and
   the first and second bit lines each directly connected to respective one of the first and second impurity layers, intersecting the fin in parallel, and being isolated from each other.

2. The semiconductor device as set forth in claim 1, which further comprises:
   a first multi-level insulation film interposed between the first gate line and the first sidewall of the fin, including a first charge-trapping insulation film;
   a second multi-level insulation film interposed between the second gate line and the second sidewall of the fin, including a second charge-trapping insulation film; and
   an insulating line pattern intersecting the fin between the first and second bit lines and covering the channel region,
   wherein the first bit line contacts the first sidewall of the insulating line pattern and the second bit line contacts the second sidewall of the insulating line pattern.

3. The semiconductor device as set forth in claim 2, which further comprises:
   a capping pattern interposed between the insulating line pattern and the channel region,
   wherein the first bit line fills a first opening that is enclosed by the interlevel insulation pattern and a sidewall of the capping pattern and reveals an upward face of the first impurity layer,
   wherein the second bit line fills a second opening that is enclosed by the interlevel insulation pattern and another sidewall of the capping pattern and reveals an upward face of the second impurity layer.

4. The semiconductor device as set forth in claim 3, wherein the first and second gate lines extend upward to be adjacent with the sidewalls of the capping pattern and protrude higher than the upward faces of the first and second impurity layers,
   wherein the first multi-level insulation film partially extends upward to be interposed between the first bit line and the protruding portion of the first gate line, and
   wherein the second multi-level insulation film partially extends upward to be interposed between the second bit line and the protruding portion of the second gate line.

5. The semiconductor device as set forth in claim 4, which further comprises:
insulation spacers interposed between the first bit line and a sidewall of the first opening, and between the second bit line and a sidewall of the second opening.

6. The semiconductor device as set forth in claim 2, wherein the first charge-trapping insulation region includes a first region adjacent to the first impurity layer and a second region adjacent to the second impurity layer, and the second charge-trapping insulation film includes third region adjacent to the first impurity layer and fourth region adjacent to the second impurity layer, wherein at least one of the first, second, third, and fourth regions is a data storage field.

7. The semiconductor device as set forth in claim 2, wherein:
the first multi-level insulation film further comprises:
a first tunnel insulation film contacting to the first sidewall of the fin; and a first blocking insulation film contacting to the first gate line, and
the second multi-level insulation film further comprises:
a second tunnel insulation film contacting to the second sidewall of the fin, and
a second blocking insulation film contacting to the second gate line,
wherein the first charge-trapping insulation film is interposed between the first tunnel insulation film and blocking insulation film, while the second charge-trapping insulation film is interposed between the second tunnel insulation film and blocking insulation film.

8. The semiconductor device as set forth in claim 2, wherein the bottom face of the fin contacts with the substrate, which further comprises a field isolation film covering lower portions of the sidewalls of the fin and the substrate around the fin, wherein the first and second gate lines are disposed on the field isolation film.

9. The semiconductor device as set forth in claim 2, which further comprises a buried insulation film disposed on the substrate, wherein the fin, and the first and second gate lines are disposed on the buried insulation film.

10. The semiconductor device as set forth in claim 9, wherein the bottoms of the first and second impurity layers are spaced apart from the top of the buried insulation film.

11. The semiconductor device as set forth in claim 1, which further comprises:
a buried insulation film interposed between the fin and the substrate;
a gate insulation film interposed between the first gate line and the first sidewall of the fin, and between the second gate line and the second sidewall of the fin; and
an insulating line pattern intersecting the fin between the first and second bit lines and covering the channel region,
wherein the first and second bit lines contact each to both sidewalls of the insulating line pattern,
wherein the bottoms of the first and second impurity layers contact with the buried insulation film to float the channel region, and
wherein the floating channel region is used as a data storage field.

12. The semiconductor device as set forth in claim 11, wherein the buried insulation film covers the substrate;
wherein the first and second gate lines are disposed on the buried insulation film, and
wherein the top of the insulating line pattern is level with the tops of the first and second bit lines.

13. The semiconductor device as set forth in claim 12, which further comprises a capping pattern interposed between the insulating line pattern and the channel region,
wherein the first bit line fills a first opening that is enclosed by the interlevel insulation pattern and a sidewall of the capping pattern and reveals an upward face of the first impurity layer,
wherein the second bit line fills a second opening that is enclosed by the interlevel insulation pattern and the other sidewall of the capping pattern and reveals an upward face of the second impurity layer.

14. The semiconductor device as set forth in claim 13, wherein the first and second gate lines extend upward to be adjacent with the sidewalls of the capping pattern and protrude higher than the upward faces of the first and second impurity layers,
which further comprises an insulator interposed between the first and second bit lines and the protruding portions of the first and second gate lines.

15. The semiconductor device as set forth in claim 14, wherein the insulator is at least one surface insulation layer formed on the protruding portions of the first and second gate lines adjacent to the first and second bit lines, and insulating spacers formed on sidewalls of the openings.

16. The semiconductor device as set forth in claim 11, wherein at least one of the first and second gate lines is configured to receive a voltage providing attraction for charges stored in the channel region.

17. The semiconductor device as set forth in claims 11, which further comprises a capacitor conductively connected to the channel region.

18. The semiconductor device as set forth in claim 17, which further comprises:
an upper interlevel insulation film covering the substrate; and
a buried contact plug penetrating the upper interlevel insulation film and the insulating line pattern in sequence and contacting to the channel region,
wherein the capacitor includes a bottom electrode connected to the buried contact plug on the upper interlevel insulation film, a dielectric film covering the bottom electrode, and a top electrode disposed on the dielectric film.

19. The semiconductor device as set forth in claim 18, which further comprises a buried spacer interposed between the buried contact plug and the first and second bit lines.

* * * * *